United States Patent
Watanabe et al.

(10) Patent No.: US 6,927,343 B2
(45) Date of Patent: Aug. 9, 2005

(54) CONTACTOR FOR TESTING MINIATURIZED DEVICES AND COMPONENTS

(75) Inventors: Naoyuki Watanabe, Kawasaki (JP); Shigeyuki Maruyama, Kawasaki (JP); Kazuhiro Tashiro, Kawasaki (JP); Daisuke Koizumi, Kawasaki (JP); Takafumi Hashitani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/266,866

(22) Filed: Oct. 9, 2002

(65) Prior Publication Data

US 2003/0127246 A1 Jul. 10, 2003

(30) Foreign Application Priority Data

Jan. 9, 2002 (JP) ........................................ 2002-002744

(51) Int. Cl.⁷ ................................................. H05K 1/00
(52) U.S. Cl. ...................... 174/254; 174/117 F; 324/754
(58) Field of Search ................................ 174/254, 256, 174/257, 261, 267, 268, 72 A, 117 F, 117 FF; 361/749, 772, 776, 789, 750, 751; 324/754, 755

(56) References Cited

U.S. PATENT DOCUMENTS

| | | | | |
|---|---|---|---|---|
| 3,168,617 A | * | 2/1965 | Richter ................ | 174/177 FF |
| 3,837,819 A | * | 9/1974 | Hibbs, Jr. ................... | 428/658 |
| 4,154,977 A | * | 5/1979 | Verma ..................... | 174/117 F |
| 4,357,750 A | * | 11/1982 | Ostman ....................... | 29/847 |
| 4,406,915 A | * | 9/1983 | Lang ....................... | 174/117 F |
| 4,616,717 A | * | 10/1986 | Luetzow ................. | 174/117 F |
| 5,681,662 A | * | 10/1997 | Chen et al. ................. | 428/607 |
| 5,974,662 A | * | 11/1999 | Eldridge et al. ............. | 29/842 |
| 6,110,823 A | * | 8/2000 | Eldridge et al. ............ | 438/660 |
| 6,515,218 B1 | * | 2/2003 | Shimizu et al. ............ | 136/256 |
| 6,531,662 B1 | * | 3/2003 | Nakamura .................. | 174/255 |

FOREIGN PATENT DOCUMENTS

| | | |
|---|---|---|
| JP | 10-111316 | 4/1998 |
| JP | 11-337579 | 12/1999 |

* cited by examiner

*Primary Examiner*—Kamand Cuneo
*Assistant Examiner*—Ishwar (I.B.) Patel
(74) *Attorney, Agent, or Firm*—Westerman, Hattori, Daniels & Adrian, LLP

(57) ABSTRACT

A contactor has a film substrate of an insulating material and plural wiring patterns on the substrate. A first end of each wiring pattern extends out from a first edge of the substrate as a first contact terminal and a second end of each wiring pattern extends out from a second edge of the substrate as a second contact terminal, and a part of the contactor located between the first end and second end can be deformed resiliently.

32 Claims, 46 Drawing Sheets

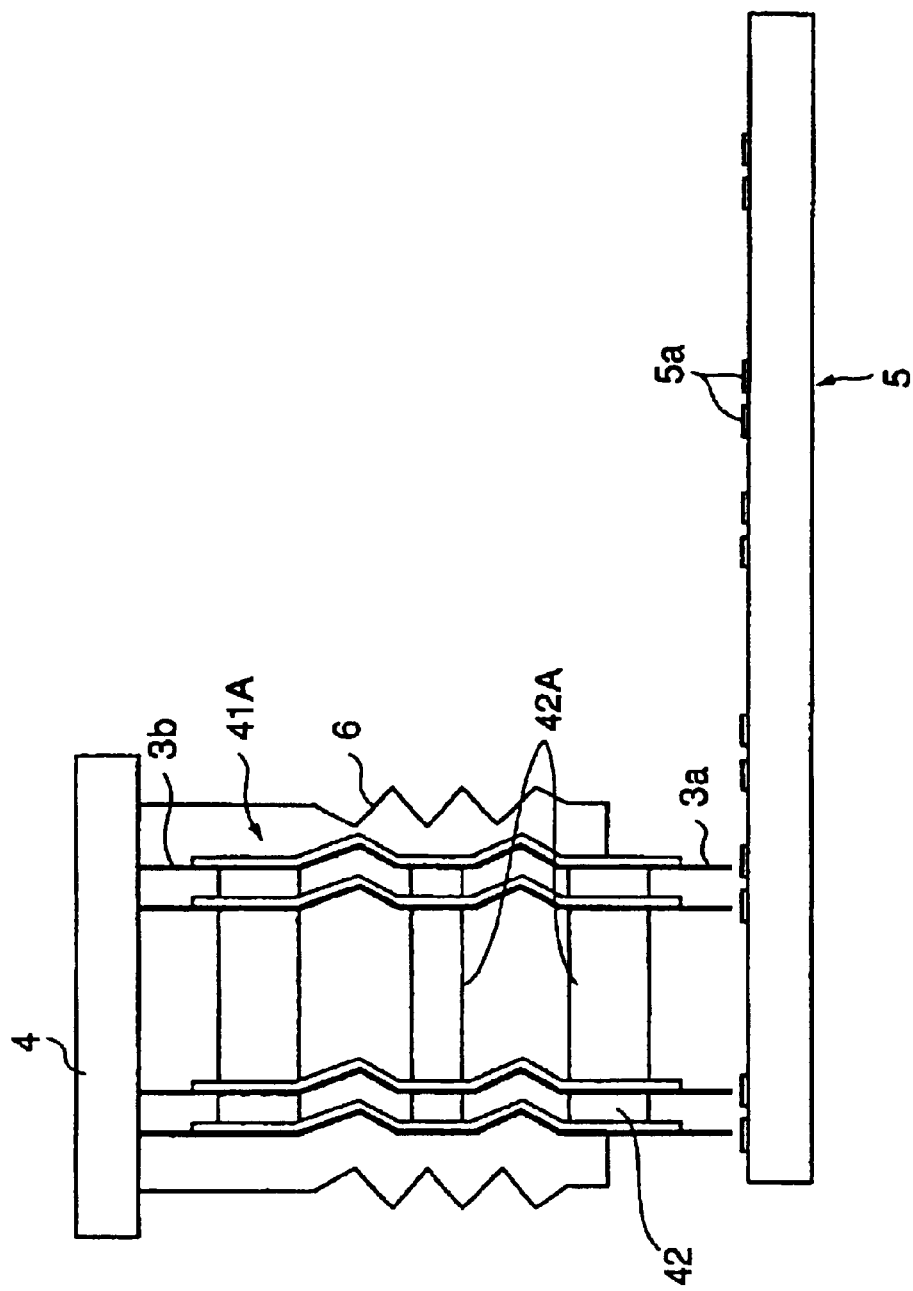

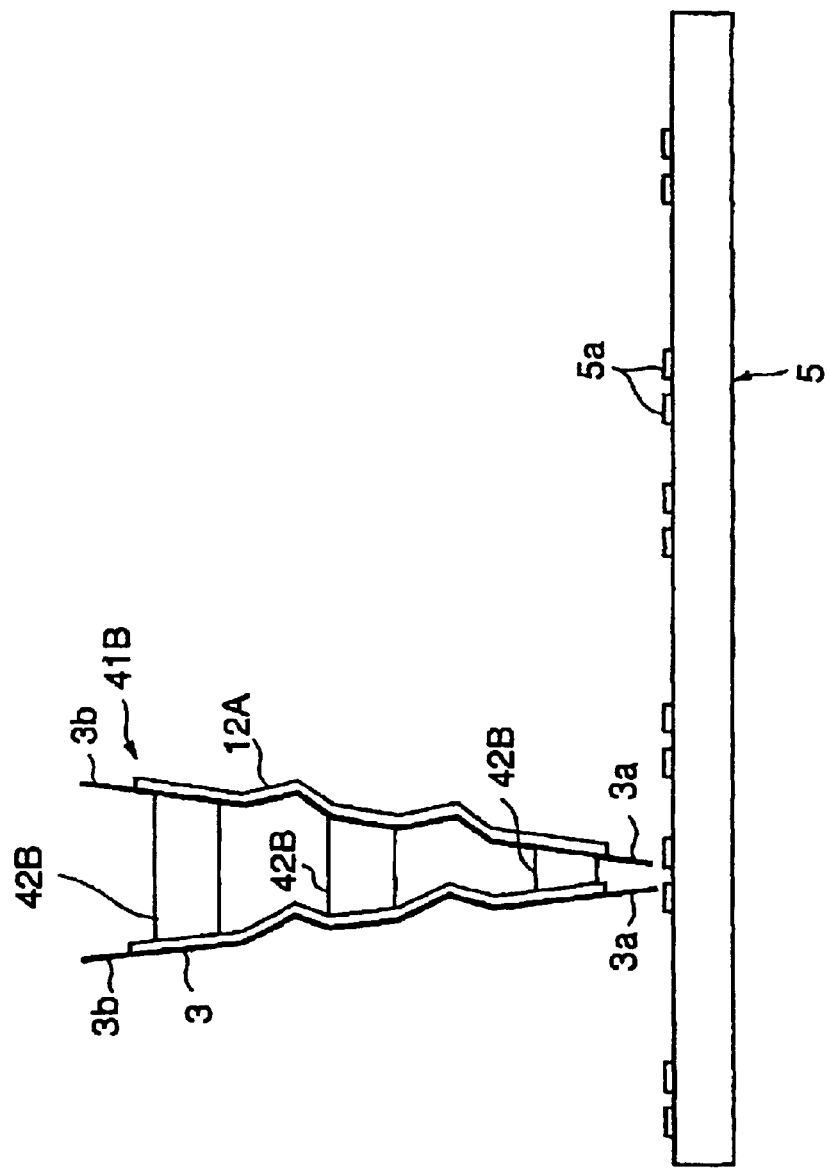

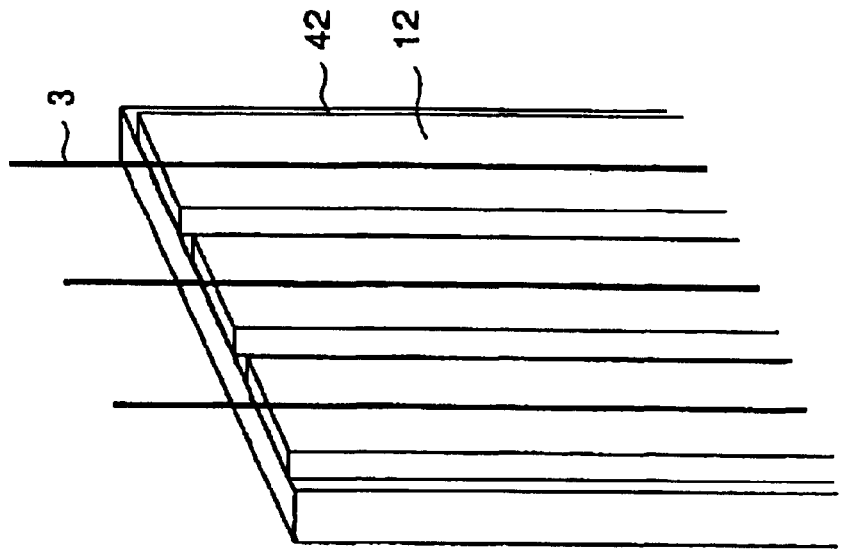
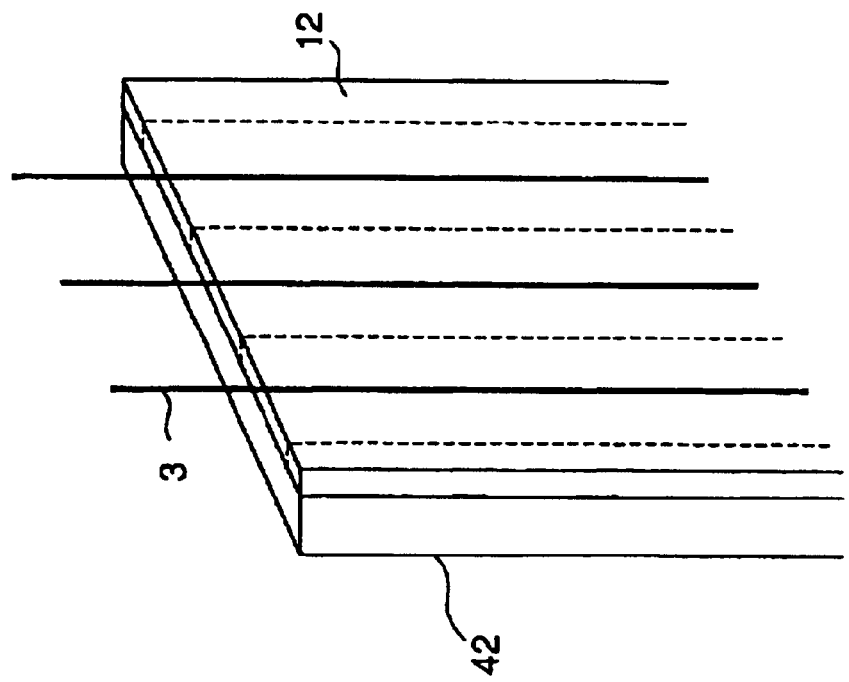
FIG.13A
FIG.13B

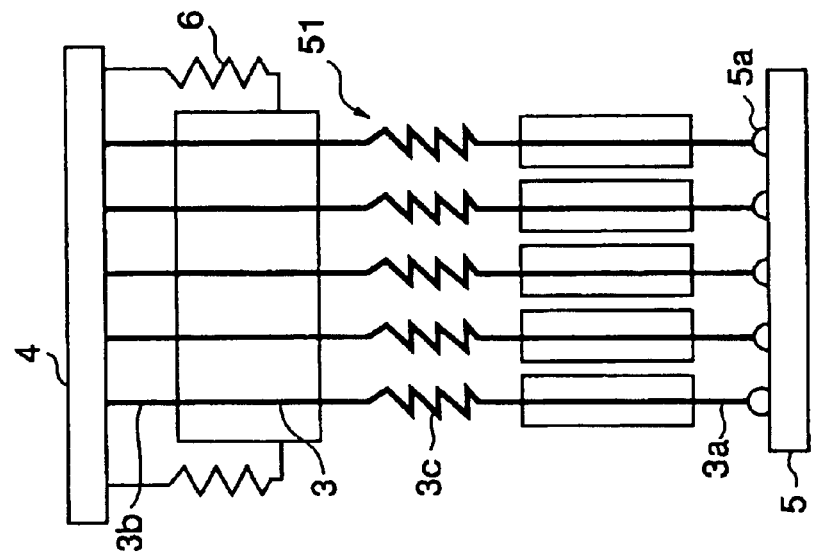
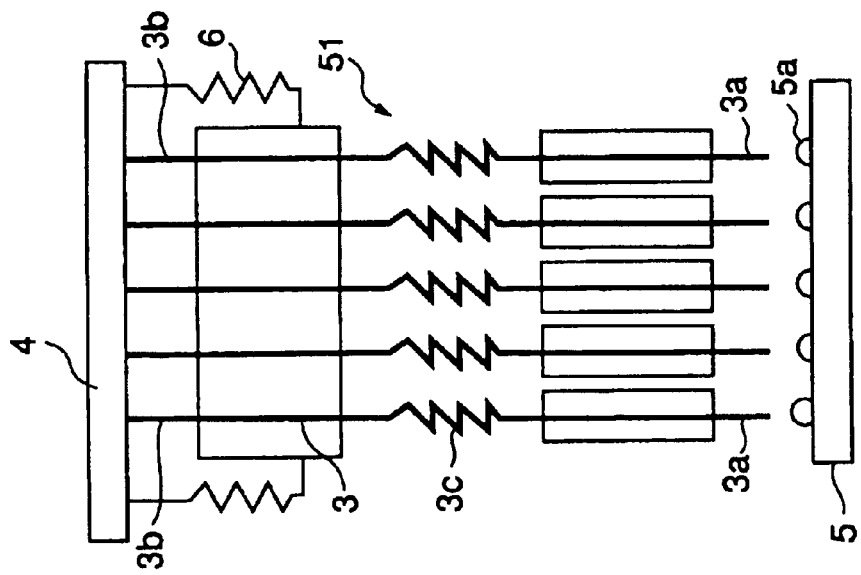

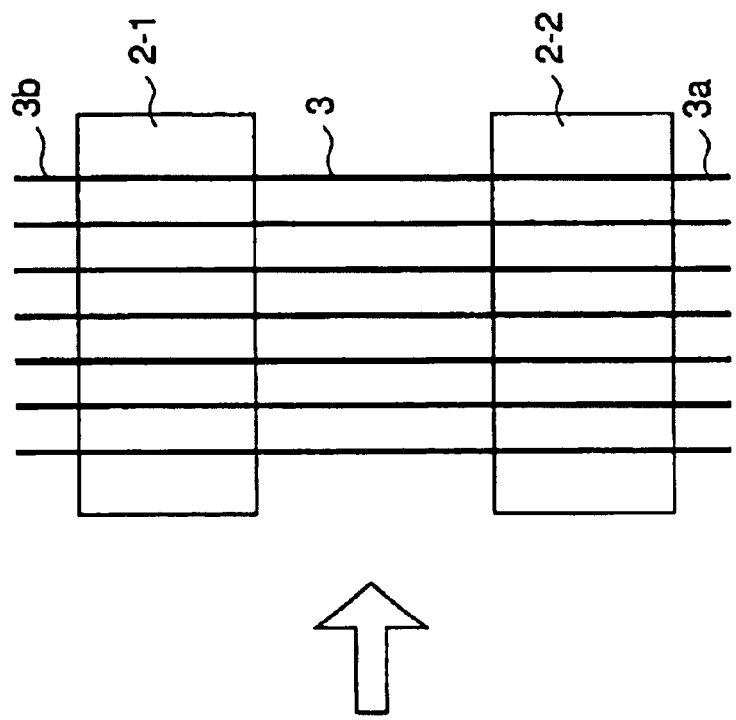
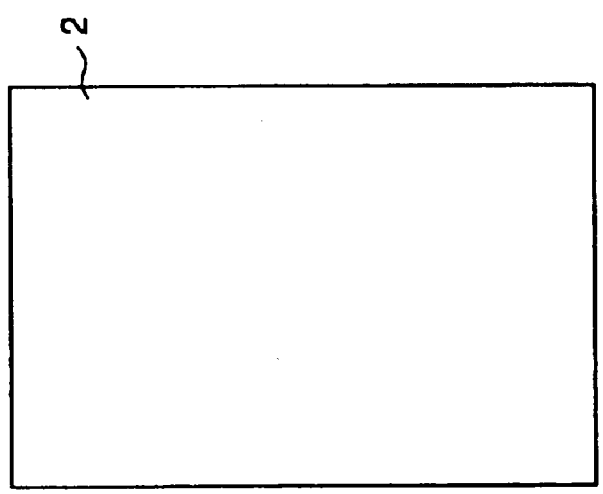

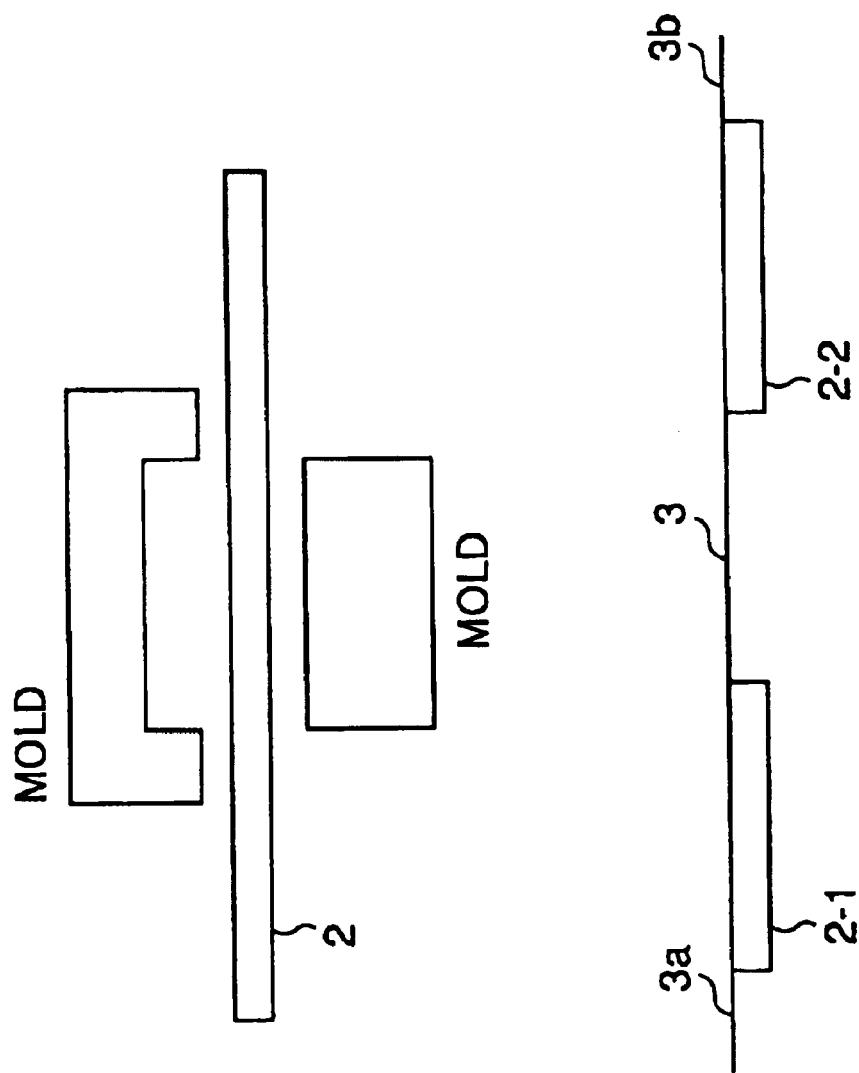

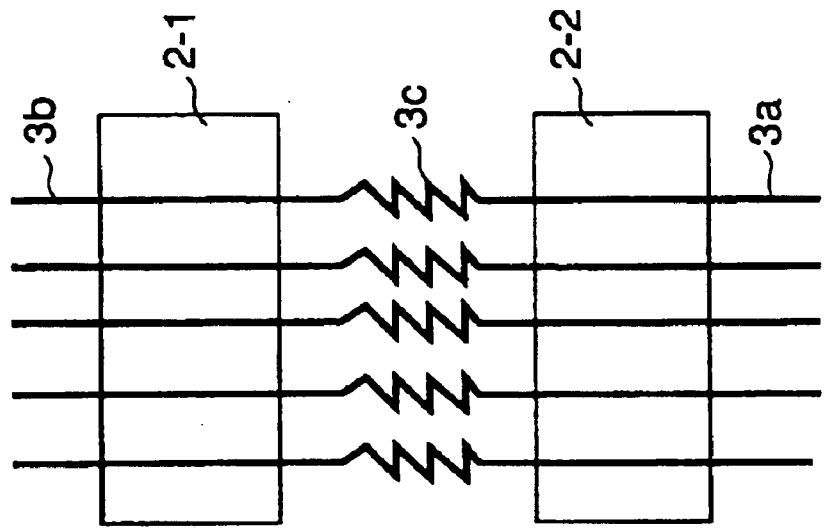
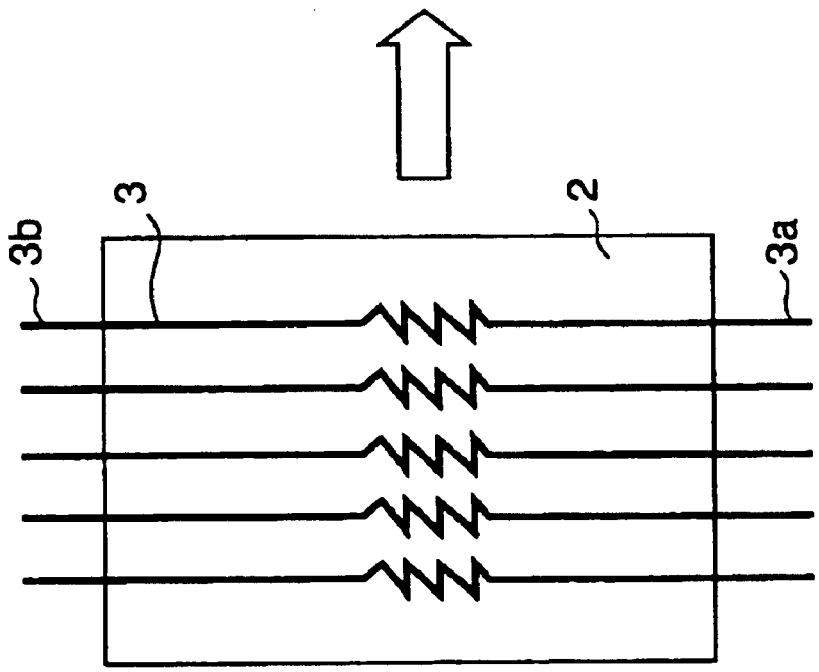

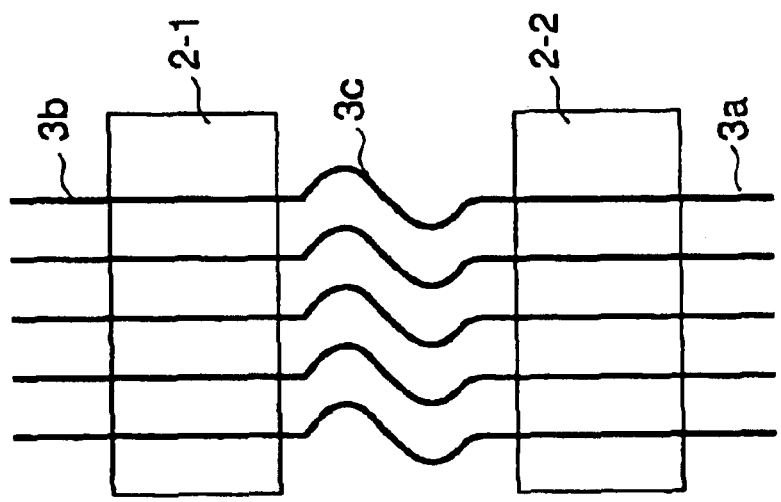
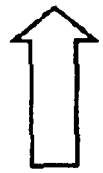
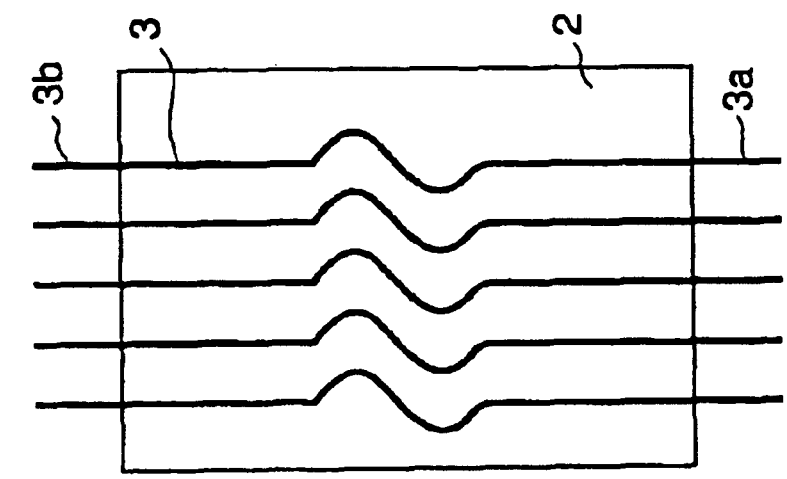
FIG.20A
FIG.20B

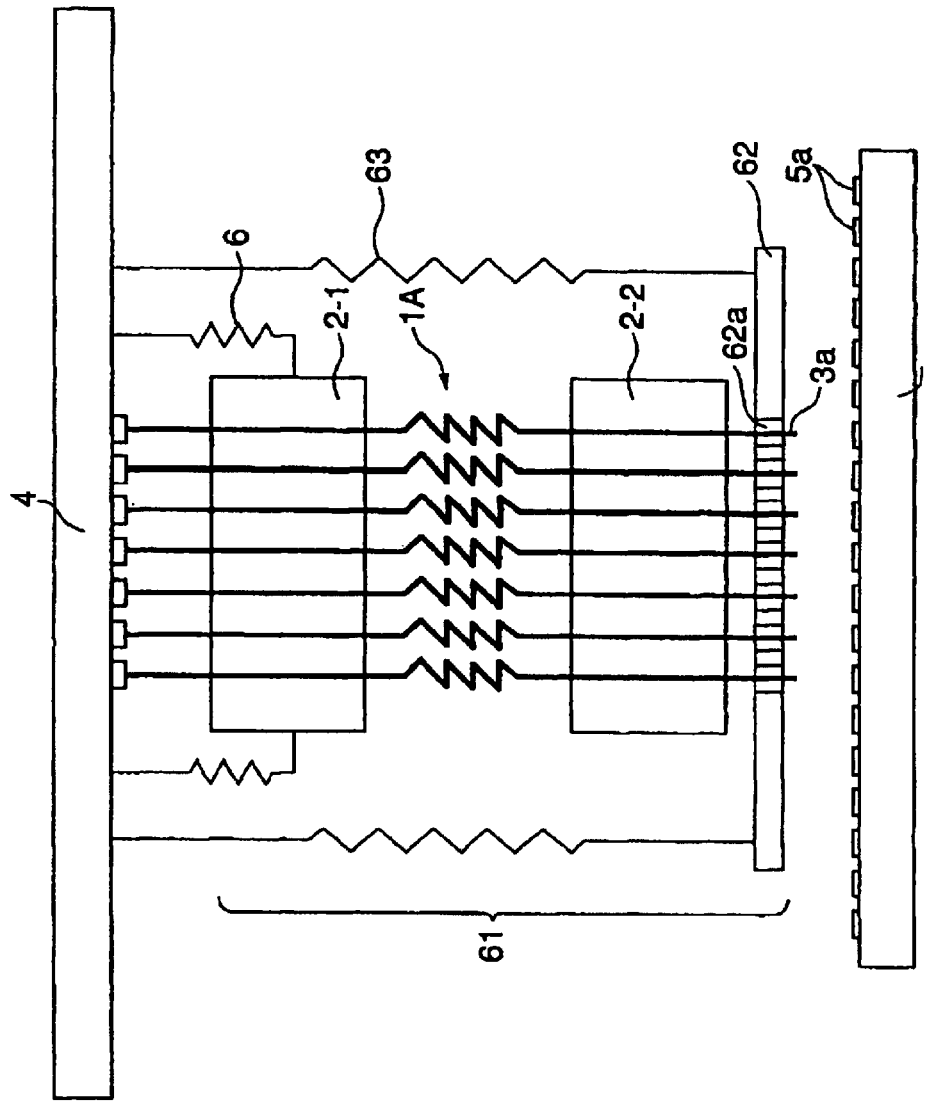

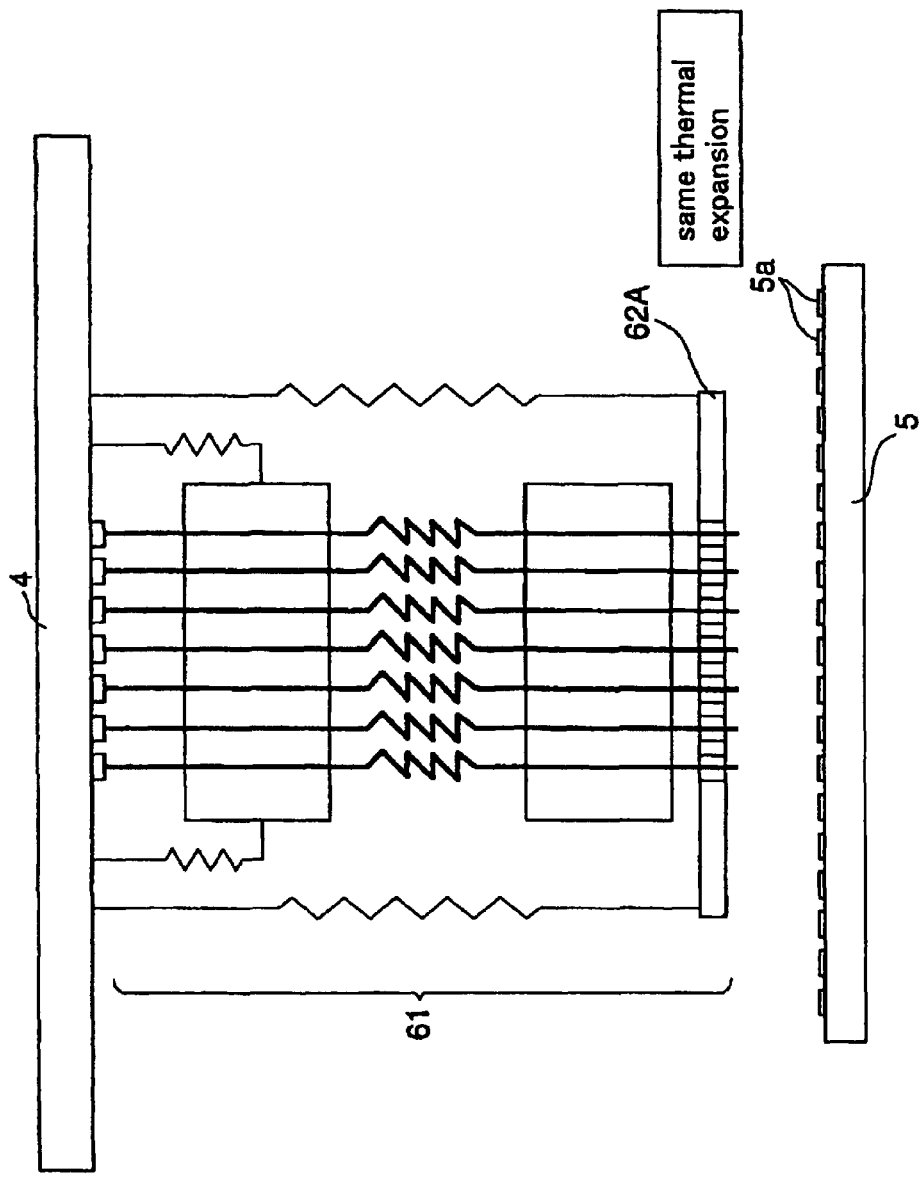

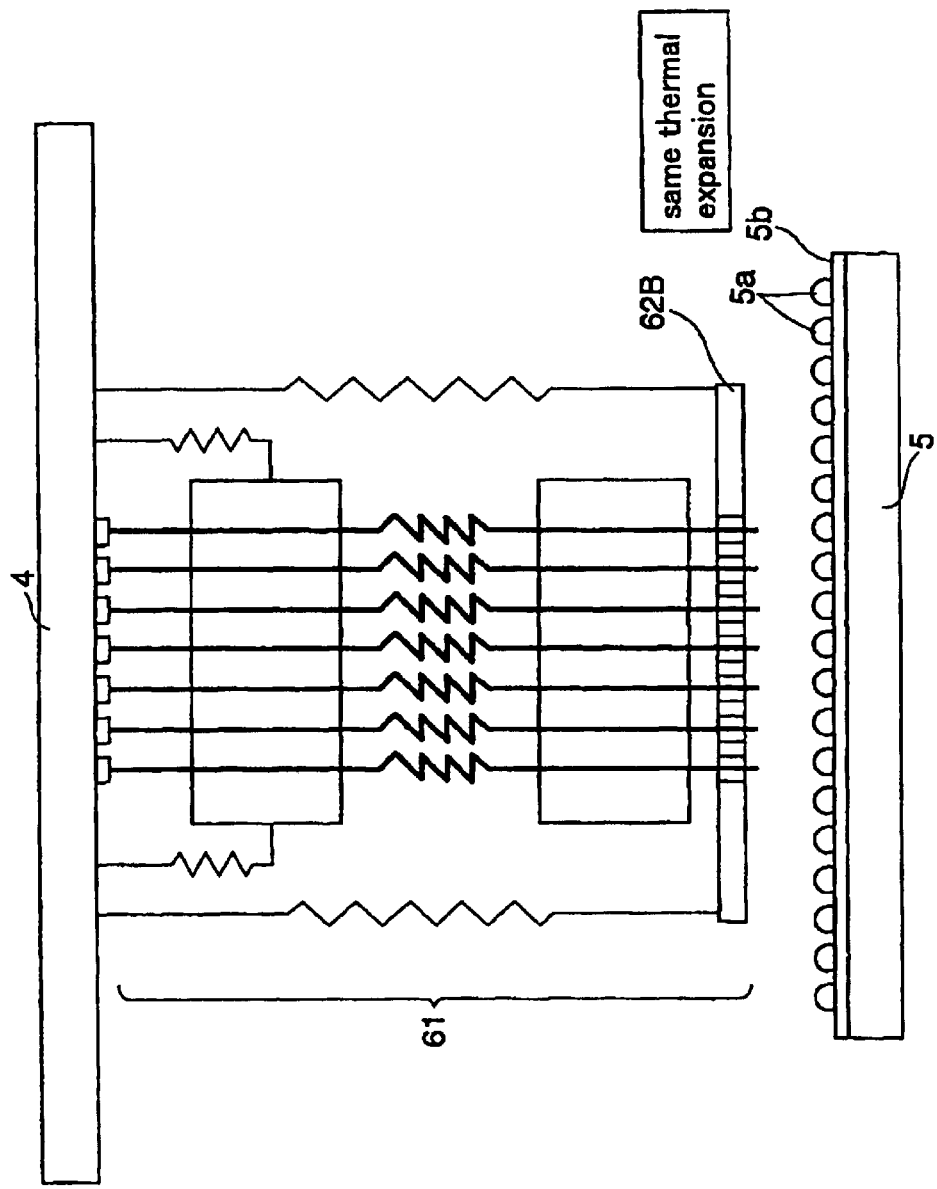

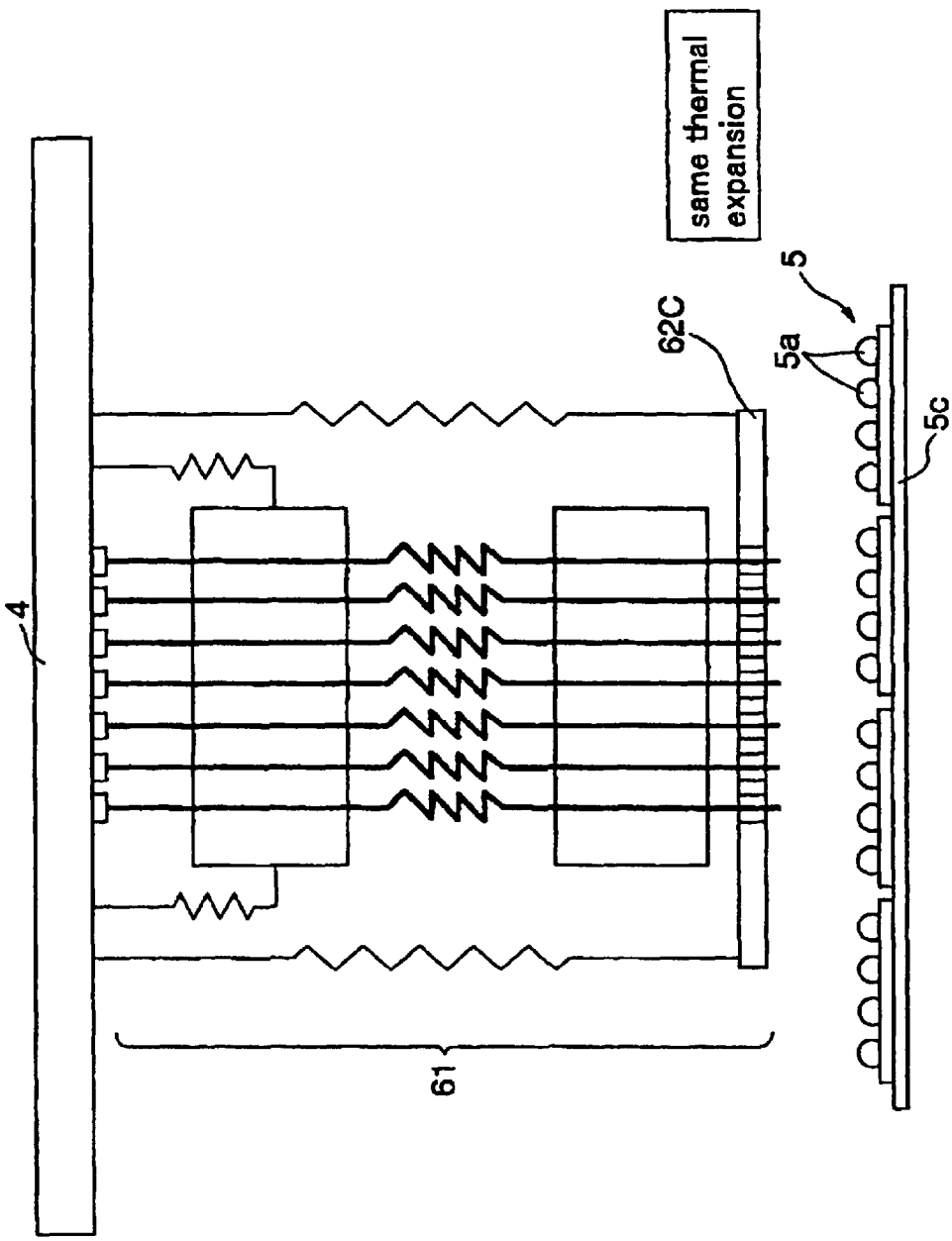

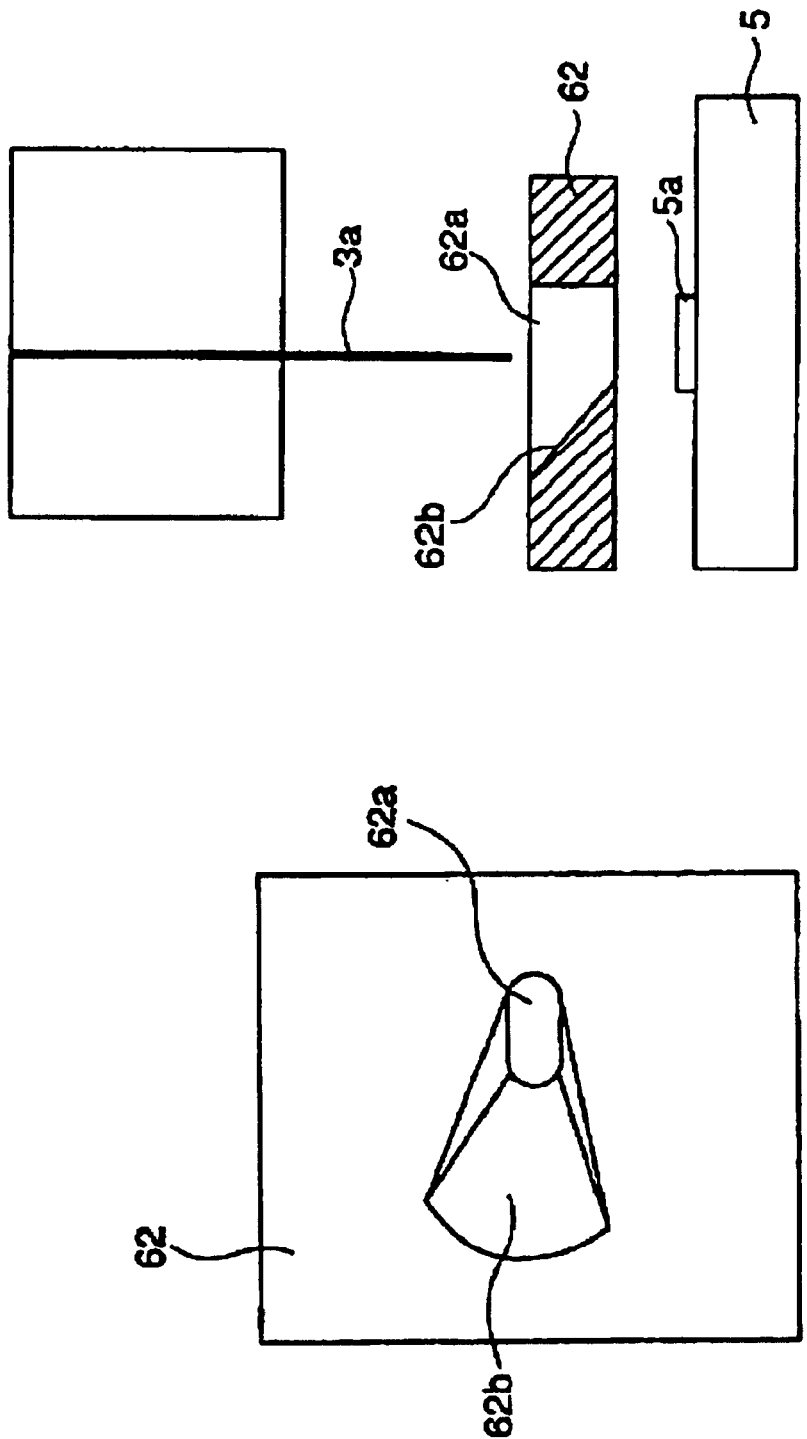

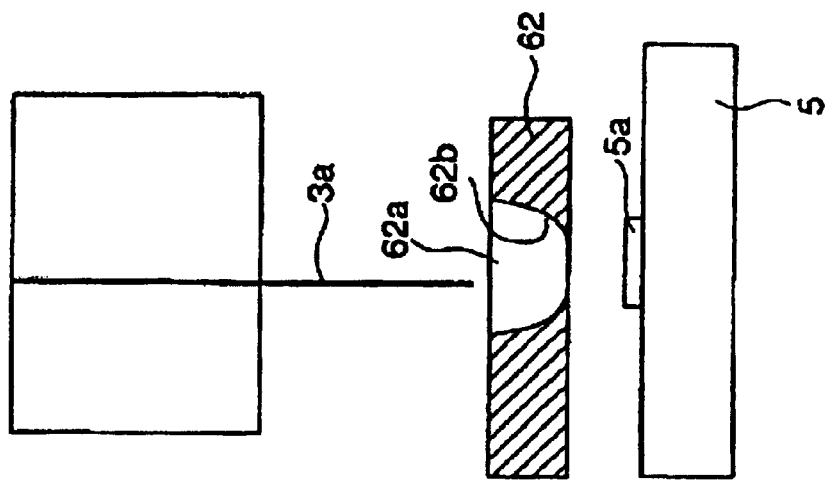
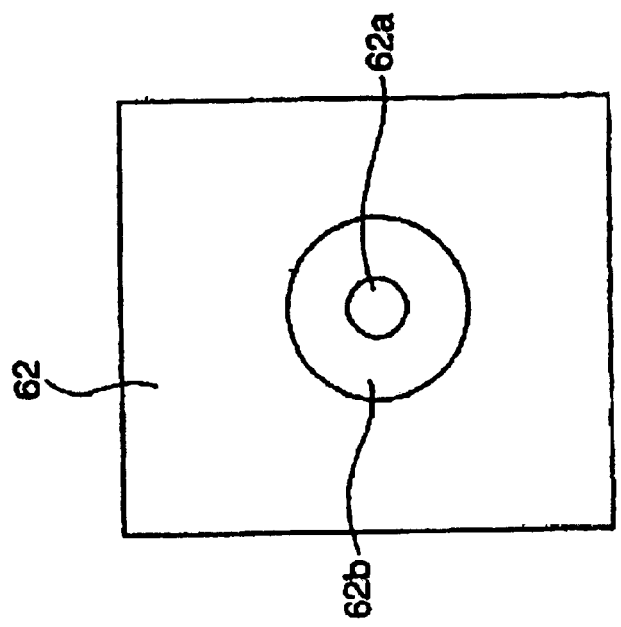

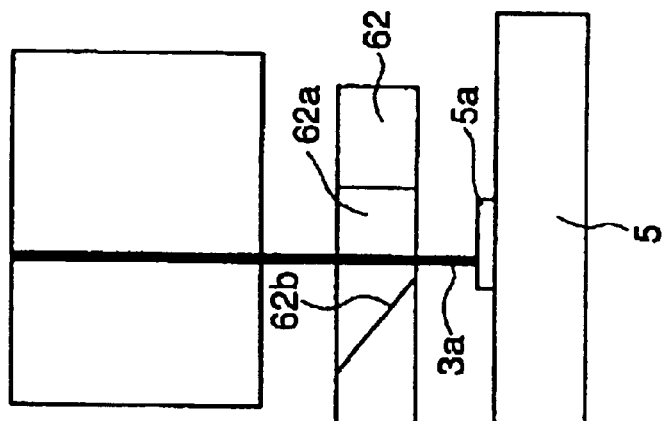
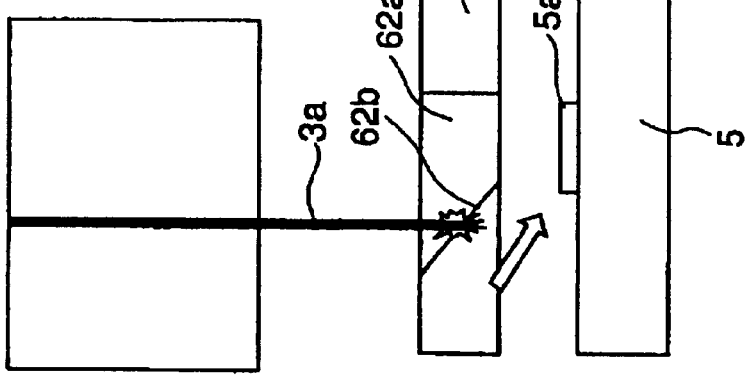
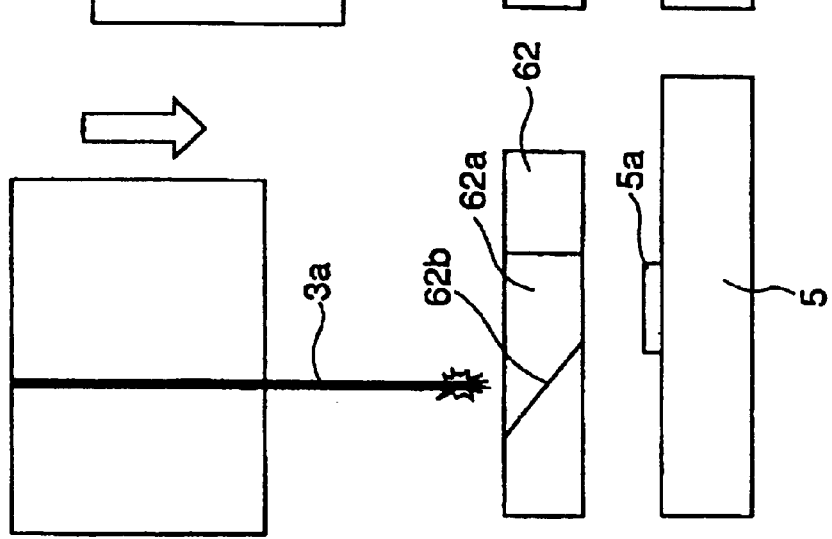

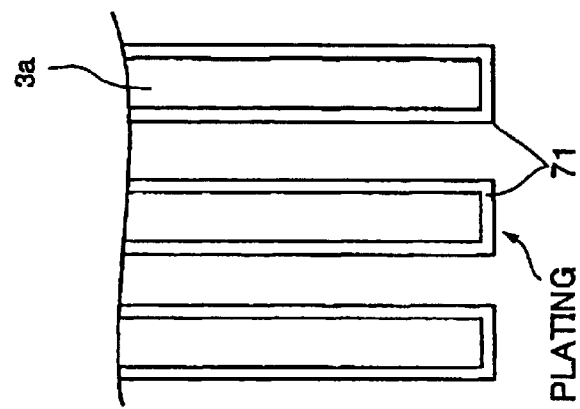
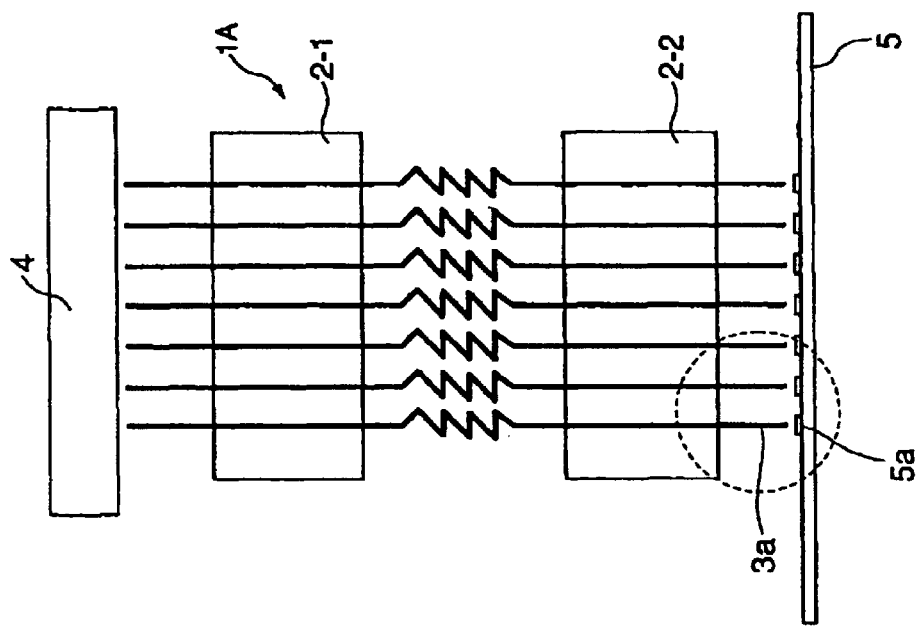
FIG.44B
FIG.44A

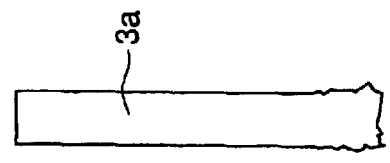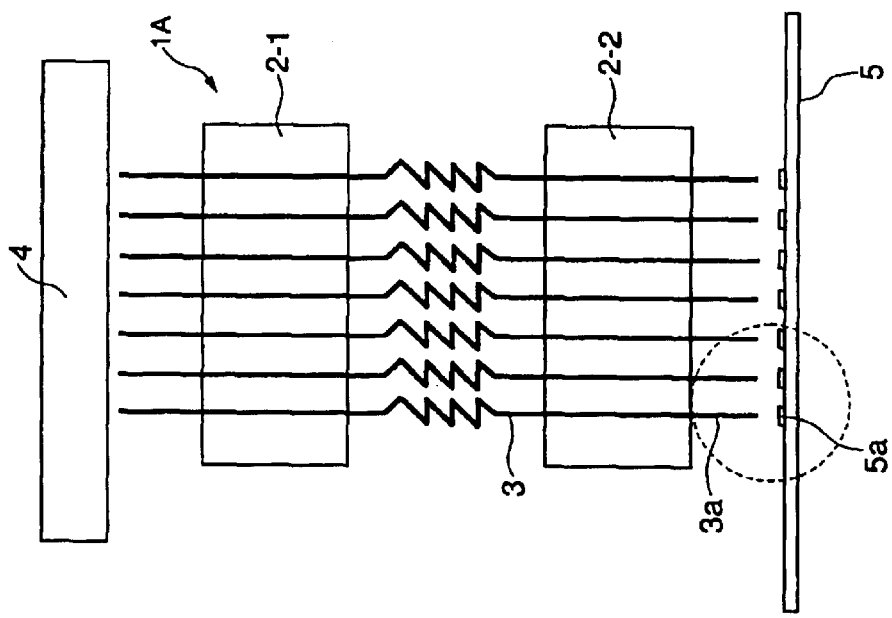

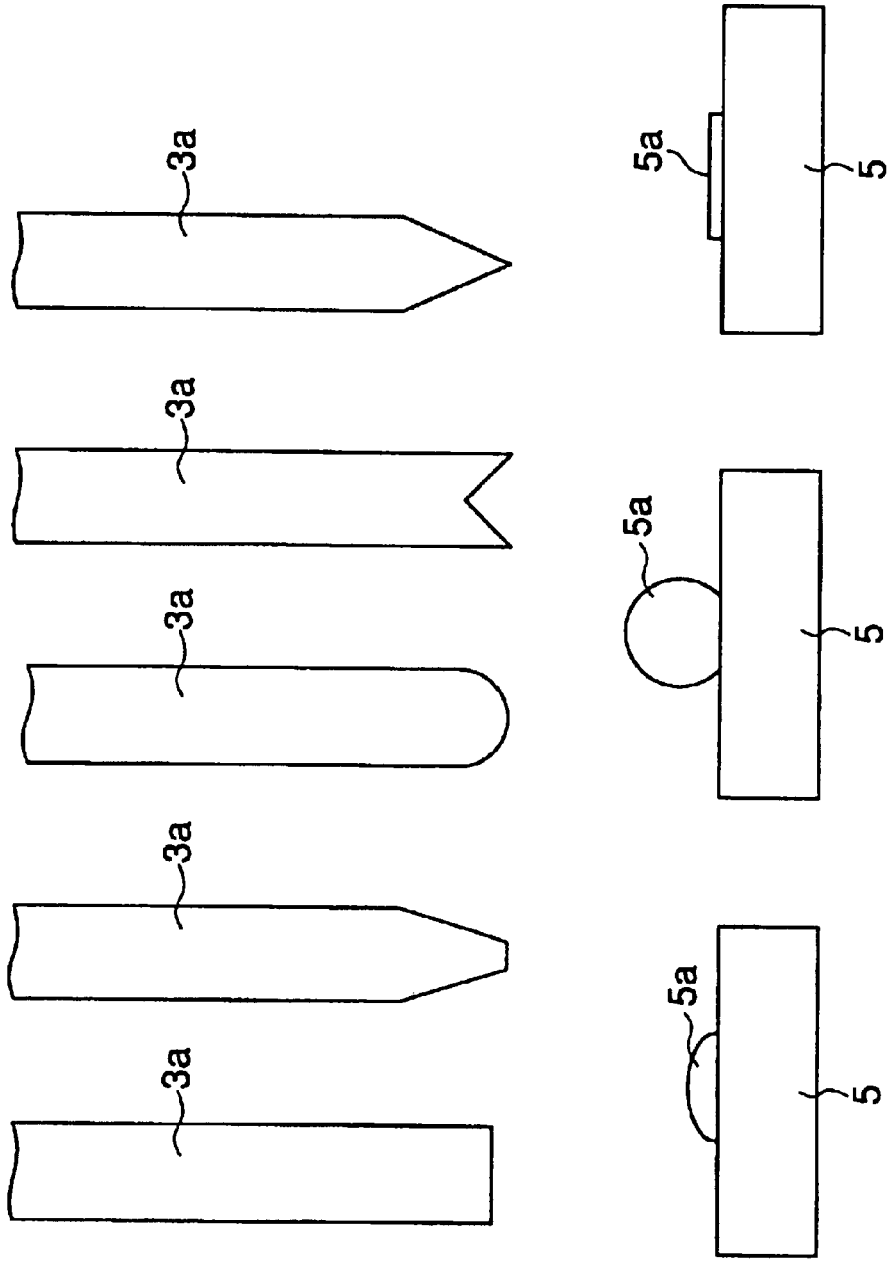

CONTACTOR FOR TESTING MINIATURIZED DEVICES AND COMPONENTS

CROSS-REFERENCE TO RELATED APPLICATION

The present application is based on Japanese priority application No. 2002-002744 filed on Jan. 9, 2002, the entire contents of which are hereby incorporated by reference.

BACKGROUND OF THE INVENTION

The present invention generally relates to contactors, and especially to a contactor making a contact to electronic components such as a large-scale integrated circuit and a contact process that uses such a contactor.

In recent years, the development of production technology in the field of semiconductor substrate is remarkable. Associated with this, interconnection patterns of large-scale integrated circuits are miniaturized, and along with this, the terminals of large-scale integrated circuits are also miniaturized. Further, the number of the terminals used in an LSI is increasing with remarkable rate.

The demand of miniaturization and high-density mounting is acute especially in the apparatuses that use a large-scale integrated circuit. For example, the number of mobile apparatuses (cellular phones, mobile personal computers, video integrated cameras etc.), in which downsizing is demanded, or high-performance computers in which the distance between adjacent LSIs has to be minimized for guaranteeing high speed operation, is increasing rapidly.

The foregoing demand also affects on the shipment mode of LSIs. Thus, the cases are increasing for shipping unpackaged LSI chips while guaranteeing the operability thereof as known as KGD (Known Good Die), or shipping the LSIs in the form of CSP (Chip Size Package), which is a small-sized package having the size of a chip.

From these circumstances, there is a need of a contactor capable of making a contact with a large number of miniature pin terminals with certainty for testing the LSIs.

Also, from the viewpoint of efficient test of LSIs, there is emerging a need of full test, in which all the tests such as final test (FT) or burn-in (BI) test are conducted for each of the LSIs in the state of wafer, before the wafer is divided into individual LSI chips. By using the full test in the state of wafer, following effects are expected.

First, the efficiency of handling is improved as compared with the case of conducting the testing on separate chips. When the size of the chips is different, it should be noted that the compatibility of the handling equipment used for the testing is lost. In the case the testing is conducted in the state of wafer, on the other hand, it becomes possible to convey the wafers of standard outer size one after another. Further, it becomes possible to control the defect information in the form of wafer map.

In the case the art of wafer-level CSP, which is subjected to intensive research and development in recent years, is used, it is potentially possible to conduct the entire process steps from the wafer process up to the assembling step in the form of the wafer. Thus, if it becomes possible to realize the test process in the state of wafer, the entire steps from the wafer process to the packaging process (assembling process) can be conducted in the state of the wafer, and the efficiency of production of LSI chips would be improved significantly.

However, as noted before, it has been difficult to realize a conductor that can contact the terminals of plural LSIs on a wafer or the terminals of entire LSIs on the wafer, in view of miniaturization of individual LSIs and hence the terminals thereof, and further in view of increasing number of the terminals.

Hereinafter, typical examples of conventional contactors (probe cards or sockets) will be summarized.

(1) Needle Type Mechanical Probe

A needle type mechanical probe has a construction of disposing a plurality of needles formed of a tungsten wire and the like on a contactor substrate of an insulating material in correspondence to respective terminals of the LSIs to be tested. Generally, a cantilever structure has been used in which the needles are provided so as to extend obliquely over the LSI wafer. Further, there is a proposal of disposing needles in a vertical direction to the terminals of the tested LSIs, by providing resiliency to the needles.

(2) Membrane Type Probe

A membrane type probe has a structure of a film circuit having a metal projection (referred to hereinafter as "bump") for the contact electrode of the probe.

(3) Anisotropic Conductive Rubber

An anisotropic conductive rubber uses an elastic rubber as an insulating base material and has a structure in which a conductive material that extends only in the thickness direction of the rubber base material such as a metal wire is incorporated.

Further, the Japanese Laid-Open Patent Application 10-111316 official gazette discloses a contactor in which an end part of the wire, extending out from an edge of a substrate, is used for a connection terminal that makes a contact with the semiconductor device to be tested and the terminals extending at the other edge of the substrate is used for the measurement terminal.

On the other hand, the abovementioned needle type mechanical probe has problems such as:

a) High cost of forming a large number of needles or pins individually;

b) Limitation in the precision of the needle tip due to the construction in which a large number of needles are arranged individually; and c) Restriction imposed on the arrangement of the needles in view of the oblique arrangement of the needles.

Thus, it has been difficult to use a needle type mechanical probe for the contactor that makes a contact with plural LSIs at the same time.

Further, the abovementioned membrane type probe has the problems as summarized below.

a) Individual contact electrodes cannot move freely

Because the contact electrode is connected to a polyimide layer forming the insulating substrate, the movable range of the individual electrode is limited. Also, in view of the fact that the contact electrode is formed of a metal bump of a hard metal that lacks flexibility, there arises a problem in that a defective contact may be caused in the case there exists a change of height between the bump electrodes.

b) High Cost

The bump constituting a contact electrode is generally formed by plating a metal. Thus, it takes time for forming a bump and the cost is inevitably increased.

Furthermore, the anisotropic conductive rubber has problems summarized as below.

a) Limited Lifetime

In the case it is used at high temperatures, in particular (it should be noted that the BI test is carried out usually at the temperature of 125° C. or more), the rubber part undergoes plastic deformation, and it can be used for only a dozens of time at best.

b) It cannot be used for the case of narrow electrode pitch.

Because it is difficult to incorporate a conductive material into a rubber, the pitch of 200-150 μm is thought as being a practical limit.

Also, the contactor disclosed in the Japanese Laid-Open Patent Application 10-111316 official gazette has a disadvantage in that it is difficult to achieve a contact for all the electrode terminals in the case there exists a variation of height in the electrode terminals of the semiconductor device to be tested, in view of insufficient stroke of the contactor terminal in the longitudinal direction. Further, there can be a possibility that sufficient contact cannot be achieved in the case the thermal expansion coefficient of the semiconductor device to be tested is different from that of the base material of the contactor as a result of displacement caused at the time of the high temperature test such as in the case of the burn-in test.

Thus, the conventional contactors have the problems summarized as follows.

1) Insufficient stroke of the contactor contact terminals

Thus, in such a conventional contactor having insufficient stroke (elastic deformation) for the contact part, a sufficient contact is achieved only when it is caused to make a contact with an aluminum pad on a wafer, in which the variation of the height is relatively small, or in the case it is used for a narrow area of the wafer. However, in the case of a wafer level CSP or molded packages formed by a simultaneous molding process, the terminals or balls on the package generally have a large variation of height, and it becomes difficult to achieve a sufficient contact by using such a conventional contactor having a small stroke or elastic deformation in the contact part. This problem becomes especially serious in the case the contactor is used to make a simultaneous contact with a thin wafer, which tends to have a warp. It should be noted that the warp of a wafer tends to increase when the thickness of the chip is reduced.

2) Positional deviation by the difference of the thermal expansion coefficient

The LSI wafer to be tested is generally formed of silicon (Si). It should be noted that the coefficient of linear thermal expansion is about 3 ppm in the case of silicon, while in the case of an insulated substrate used for the contactor such as a resin, the value of the coefficient of linear thermal expansion becomes several ten ppm (13~30 ppm, for example). Thus, even in the case the contactor is contacting properly at ordinary temperatures, the location of the contactor may be deviated due to the difference of the coefficient of linear thermal expansion when it is used at a high temperature as in the case of a BI test. In an extreme case, the contactor may miss the intended terminal or make a contact with a terminal next to the intended terminal. Further, a similar problem occurs also in the case of the wafer level CSP or packages molded by a simultaneous molding process, in view of the fact that the coefficient of linear thermal expansion is different between the insulated substrate material and the package material such as seal resin. In the case polyimide is used for the insulating substrate, for example, the linear thermal expansion coefficient takes a value of about 13 ppm and there can occur a displacement as much as 100 μm at the peripheral part of an 8-inch wafer, which has a diameter of about 100 mm, when it is heated to 125° C., even in the case the contactor is aligned properly at ordinary temperature.

SUMMARY OF THE INVENTION

Accordingly, it is a general object to provide a novel and useful contactor and a fabrication process as well as a contact process wherein the foregoing problems are eliminated.

Another and more specific object of the present invention is to provide a contactor that can achieve a positive contact to terminals of plural semiconductor devices as in the case of a wafer-level semiconductor device even when the semiconductor device and the terminals thereof are miniaturized.

Another object of the present invention is to provide a contactor for electrically connecting a substrate of a testing apparatus with an object to be tested, comprising:

a film substrate of an insulating material; and a plurality of wiring patterns provided on said substrate;

a first end of each wiring pattern extending out from a first edge of said substrate as a first contact terminal, a second end of each wiring pattern extending out from a second edge of said substrate as a second contact terminal, wherein a part of said contactor located between said first end and second end can be deformed resiliently.

According to the present invention, it becomes possible to obtain a contact force by utilizing the resilient deformation of the substrate or wires of the contactor, and it becomes possible to realize a contactor of simple structure not using a special resilient member. In the present invention, the contact terminals are provided as a part of the wires, and thus, the contactor is easily formed in conformity with a minute pitch of the electrodes by way of patterning process. Further, the spring constant of the wires or the substrate is small, and it becomes possible to realize a large stroke for the contact terminals. Thereby, it becomes possible to make a contact with a large number of electrodes simultaneously in a single step. Also, it is possible to mount various electronic components on the substrate of the contactor.

Further, according to the present invention, the contact terminals can be arranged in a two-dimensional array, and thus, the contactor of the present invention can be used for testing an area-array type semiconductor device, and the like.

Further, according to the contactor of the present invention, it becomes possible to prevent the deformation of the substrate even in the case there is a difference of coefficient of thermal expansion between the substrate and a spacer provided between adjacent substrates, as the substrate follows the thermal expansion of the spacer Further, according to the contactor of the present invention, it is possible to align the contact terminals accurately to the electrodes of the tested body by using a contact terminal guide.

According to one mode of the present invention, the movement of the contact terminals caused by thermal expansion can be set substantially identical with the movement of the electrodes of the test body, and it becomes possible to eliminate the displacement of the contact terminals with respect to the electrodes on the tested body even when the testing is conducted at elevated temperatures.

Other objects and further features of the present invention will become apparent from the following detailed description when read in conjunction with the attached drawings.

BRIEF DESCRIPTION OF THE DRAWINGS

FIG. 11 is a side view shows a first modification of the contactor shown in FIGS. 10A and 10B;

FIG. 12 is a side view showing a second modification of the contactor shown in FIGS. 10A and 10B;

FIGS. 13A and 13B are oblique views showing examples of applying a processing to a substrate in relation to thermal expansion coefficient;

FIGS. 14A and 14B are front views showing the construction of a contactor according to a sixth embodiment of the present invention;

FIGS. 17A and 17B are diagrams explaining a process of making of the contactor of FIG. 1;

FIGS. 18A and 18B are diagrams explaining a process of making of the contactor of FIG. 1;

FIGS. 19A and 19B are diagrams explaining a process of making of a contactor of FIG. 3;

FIGS. 20A and 20B are diagrams showing an example that uses an S-shaped form for the deformable part in the contactor of FIGS. 19A and 19B;

FIG. 27 is a front view showing the contactor of FIG. 25 in the state in which the contactor is attached to a probe substrate;

FIG. 28 is a diagram showing an example of forming the contact terminal guide with a material having a coefficient of thermal expansion equivalent to that of a silicon wafer;

FIG. 29 is a diagram showing an example of forming the contact terminal guide with a material having a coefficient of thermal expansion equivalent to that of a seal material of a wafer-level CSP package;

FIG. 30 is a diagram showing an example of forming the contact terminal guide with a material having a coefficient of thermal expansion equivalent to that of a dicing film;

FIGS. 33A and 33B are diagrams explaining the form of a guide hole;

FIGS. 35A and 35B are diagrams explaining another guide hole having a curved slope surface;

FIGS. 36A–36C are diagrams showing the construction of overlaying a contactor in alignment with the electrodes of a semiconductor device of peripheral type;

FIGS. 44A and 44B are diagrams showing an example of applying a plating process to a tip end part of a contact terminal of a contactor;

FIGS. 45A and 45B are diagrams showing an example in which a rough surface is formed on a tip end part the contact terminals; and FIG. 46 shows various examples of contact terminals and electrodes.

DETAILED DESCRIPTION OF THE INVENTION (FIRST EMBODIMENT)

Figure 1:
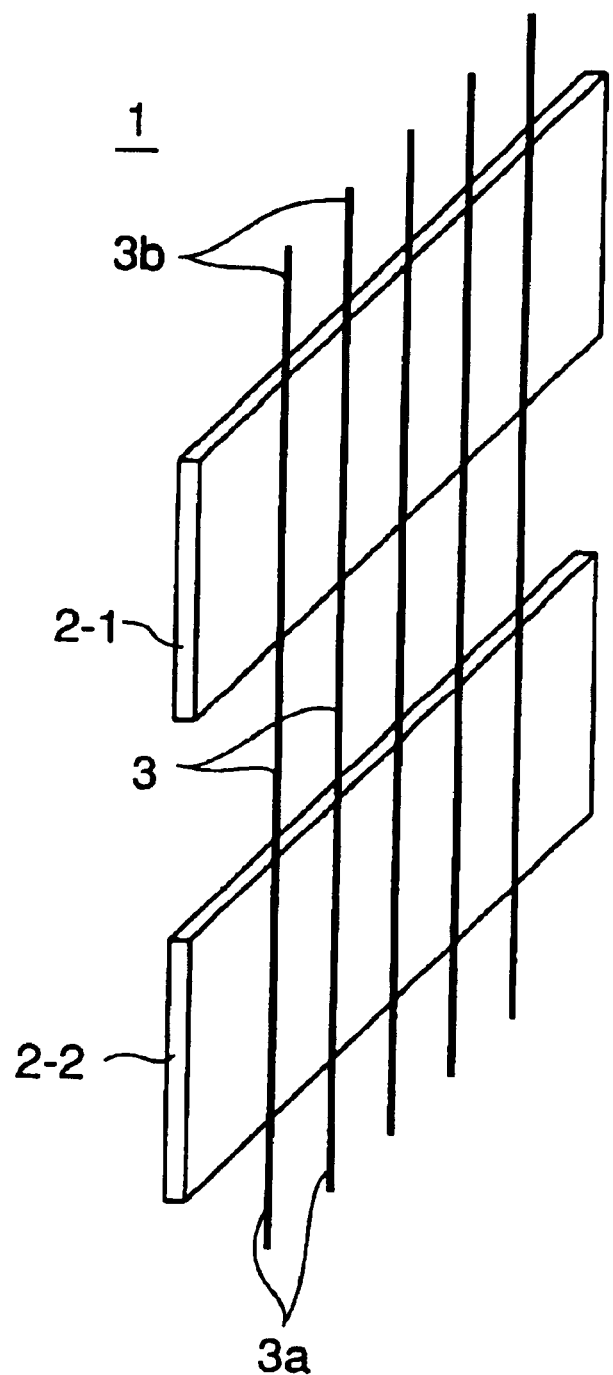
FIG. 1 is an oblique view showing the construction of a contactor according to a first embodiment of a present invention.

FIG. 1 is an oblique view of the contactor according to a first embodiment of a present invention.

As represented in FIG. 1, the contactor of the first embodiment of the present invention is formed of two thin substrates 2-1 and 2-2 and a plurality of wires 3. The substrates 2-1 and 2-2 are thin substrates of an insulating material such as polyimide. The substrates 2-1 and 2-2 are disposed in a spaced manner and the plural wires 3 are provided parallel with each other so as to connect the substrates 2-1 and 2-2.

The wires 3 are formed of thin lines of a conductive metal such as copper. The wires 3 are capable of causing elastic deformation to some extent. Each of the wires 3 has an end part functioning as a contact terminal 3a and another end part functioning as a contact terminal 3b.

Figure 2:
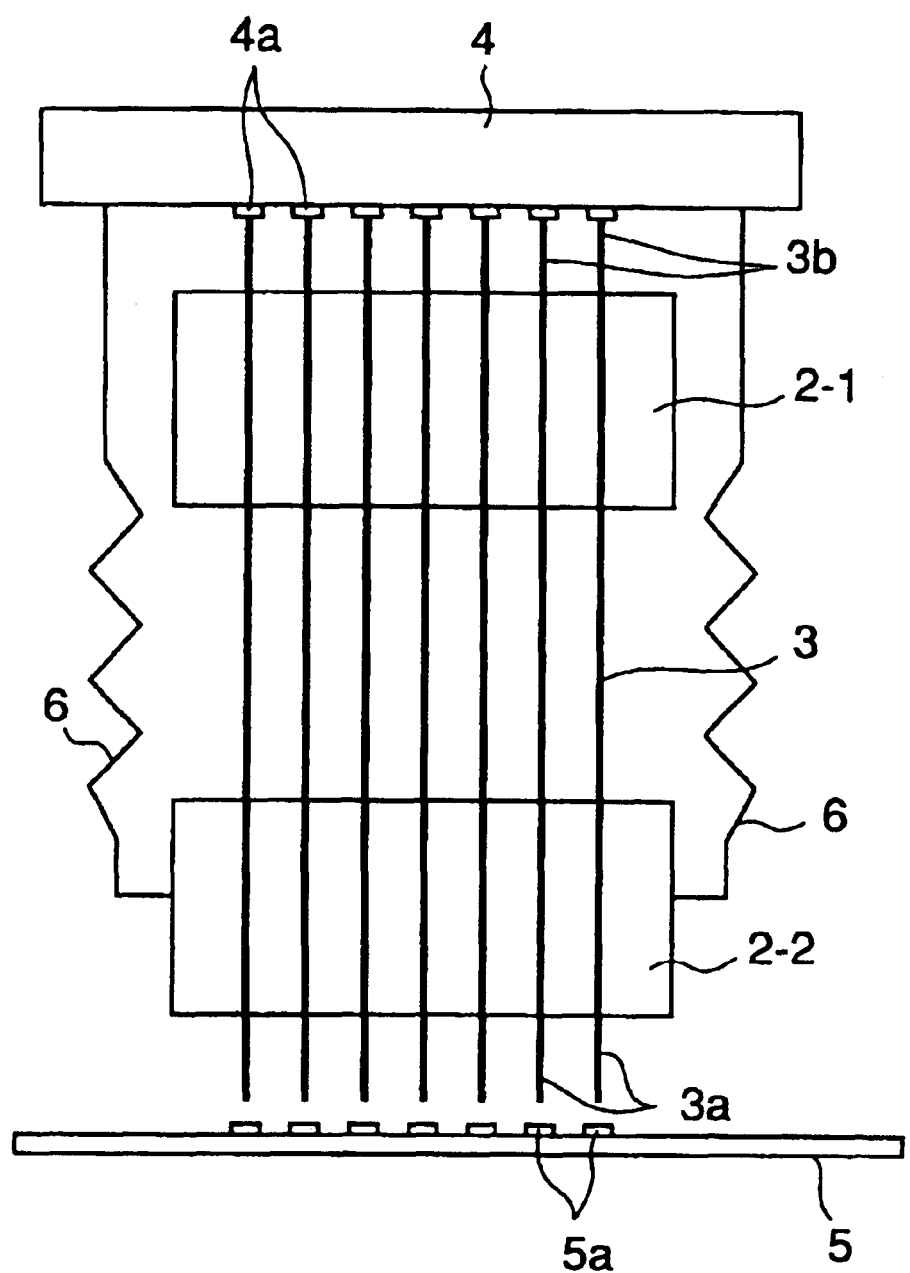
FIG. 2 is a diagram showing a state in which the contactor of FIG. 1 is disposed between an electronic component and a probe substrate.

FIG. 2 is a diagram showing the state for the case the contactor of FIG. 1 is disposed between an electronic component and a probe substrate.

Referring to FIG. 2, it can be seen that a contactor 1 is disposed between a probe substrate 4 and electronic component 5. The probe substrate 4 is a substrate located at the side of a circuit tester and is connected to a testing device not illustrated. On the other hand, the contact terminals 3b of the contactor 1 are arranged so as to make a contact with corresponding electrodes 4a of the probe substrate 4. The electronic component 5 may be a semiconductor device (LSI etc.) to be tested and carries plural electrodes 5a on a surface thereof. Thereby, the contact terminals 3a of the wires 3 make a contact with the corresponding electrodes 5a.

Thus, the contactor 1 is arranged between the probe substrate 4 and the electronic component 5 and the contact terminals 3b of the wires 3 are contacted with the electrodes 4a of the probe substrate 4 and the contact terminals 3a are contacted with the electrode 5a of the electronic component 5. With this, the electrodes 5a of the electronic component 5 are connected to the probe substrate 4 and hence to the testing device electrically, and it becomes possible to conduct a test of the electronic component 5 while causing to flow an electric current to the electronic component 5.

It should be noted that the wires 3 are arranged parallel with each other with an interval (pitch) identical with the interval of the electrodes 5a of the electronic component 5. In the case the electronic component 5 is an LSI of narrow electrode pitch and the electrodes 5a are arranged with an interval of 40 μm, for example, each of the wires 3 may have a width of 20 μm and arranged with an interval of 20 μm. The process of forming the of contactor 1 will be explained later in detail.

It should be noted that, because the contactor 1 has a simple structure of including only the substrates 2-1 and 2-2 and the wires 3, it is easy to form the wires 3 with a small pitch. Thus, the contactor of the present embodiment can be used successfully to the semiconductor devices of narrow electrode pitch as in the above case.

It should be noted that the contactor 1 is contacted to the electronic component 5 in the state in which it is mounted on the probe substrate 4. Thereby, the contactor 1 is fixed to the probe substrate 4 by mounting the substrate 2-2 of the contactor 1 on the probe substrate 4 by means of a support mechanism 6. The support mechanism 6 urges the contactor 1 to the probe substrate 4 such that the contact terminal 3bs are contacted to the corresponding electrodes 4a of the probe substrate 4. In this state, the contactor 1 is urged to the electronic component 5 and the contact terminals 3a are contacted with the electrodes 5a of the electronic component 5.

When the contactor 1 is pressed between the probe substrate 4 and the electronic component 5, the wires 3 undergo elastic deformation between the substrate 2-1 and the substrate 2-2. Thereby, it becomes possible to achieve a positive contact between the contact terminals 3a and the electrodes 5a of the electronic component 5 and also between the contact terminals 3b and electronic component 5 by the resilience of the wires 3.

It should be noted that the wires 3 are formed of a thin band of a metal and has a relatively small spring constant. Therefore, an appropriate contact force is maintained even in the case the distance between the probe substrate 4 and the electronic component 5 is changed variously.

Figure 3:
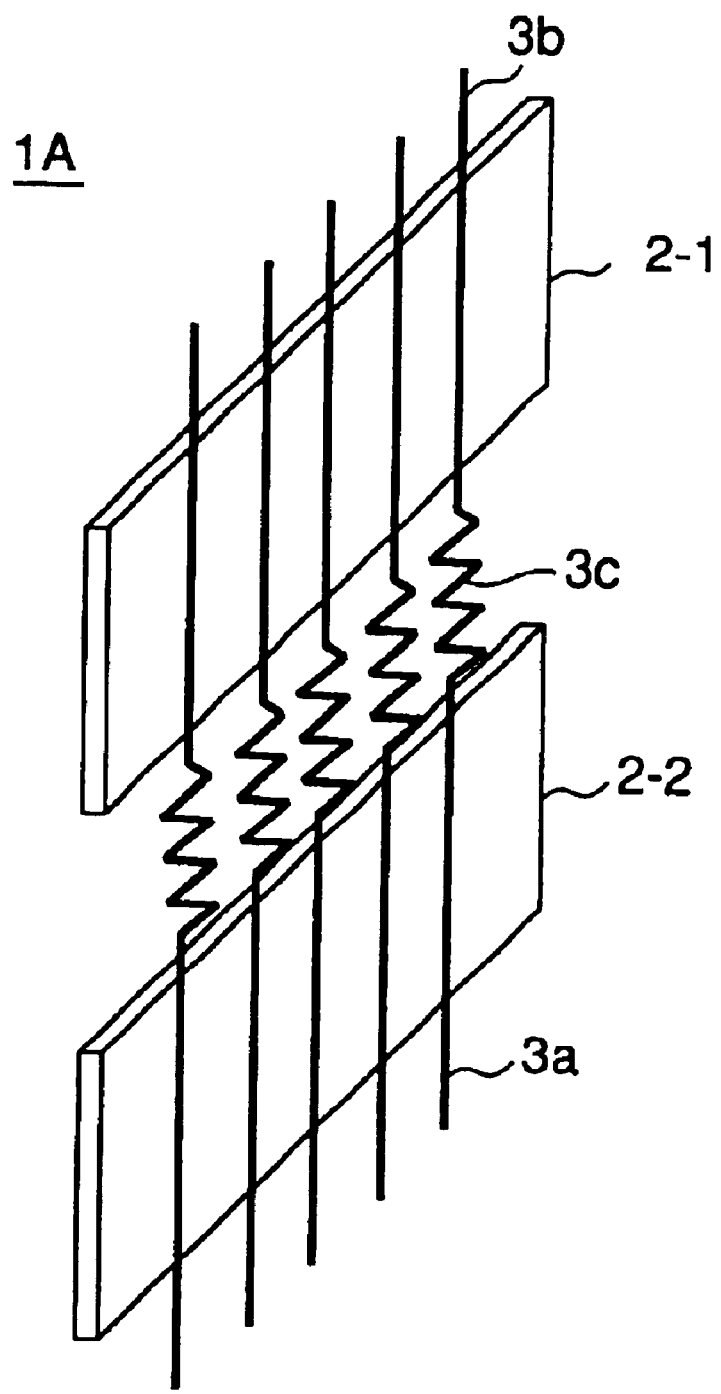
FIG. 3 is an oblique view showing a modification of the contactor of FIG. 1.

FIG. 3 is an oblique view diagram showing a contactor 1A according to a modification of the abovementioned contactor 1.

It should the contactor 1A of FIG. 3 has a construction similar to that of the contactor 1 of FIG. 1, except that there is provided a deforming part 3c between the substrate 2-1 and the substrate 2-2 in each of the wires 3. In the example of FIG. 3, the deformable part 3c has a zigzag form, and thus, the wire 3 easily extends or shrinks in the longitudinal direction thereof.

By providing the deformable part 3c in the wires 3 as shown in FIG. 3, it is possible to obtain a contact force by the elastic deformation of the deformable part 3c, and it becomes possible to provide a contactor having a reduced spring constant. Further, it should be noted that the deformable part 3c is not limited to the zigzag shape as shown in FIG. 3 but can take any other forms such as a trigonometric function form or U-shaped form, as long as it can be extended or compressed in the longitudinal direction of the wires 3.

(SECOND EMBODIMENT)

Next, a second embodiment of the present invention will be explained with reference to FIG. 4.

Figure 4:
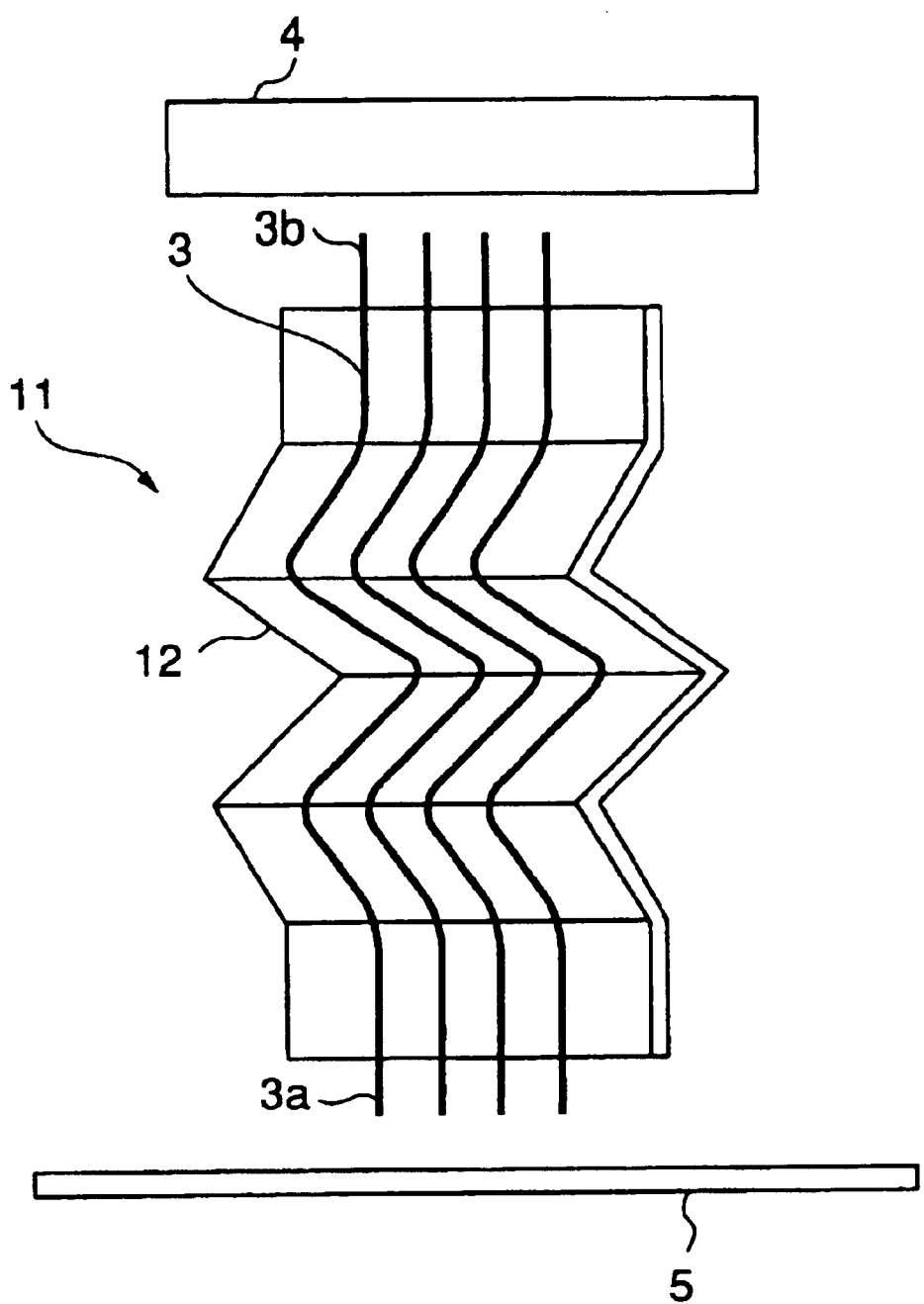
FIG. 4 is an oblique view showing the construction of a contactor according to a second embodiment of the present invention.

FIG. 4 is an oblique view diagram of a contactor 11 according to a second embodiment of a present invention.

Referring to FIG. 4, the contactor 11 also has a construction similar to the abovementioned contactor 1 in that it is attached to the probe substrate 4. Thus, the contactor 11 is provided between the probe substrate 4 and the electronic component 5. The explanation that overlaps with those explained before will be omitted.

In contactor 11 shown in FIG. 4, it should be noted that the wires 3 are formed on a single substrate 12, while the substrate 12 itself has a construction of causing a deformation. Thus, the wires 3 undergo an elastic extension or contraction in the longitudinal direction thereof together with the substrate 12. In other words, the wires 3 undergo bending together with the deformation of the substrate 12. Preferably, the substrate 12 is formed of an insulation material such as a thin polyimide film.

In the case of the present embodiment, the spring constant of the contactor 11 is decided by the spring constant of the substrate 12 and the spring constant of the wires 3.

In the case the spring constant of the substrate 12 is large, it is preferable to provide a cut into the part of the substrate 12 that undergoes the deformation so as to facilitate the deformation.

By providing a cut into the substrate 12 like this, it is possible to control the spring constant of the contactor 11 to be substantially equal to the spring constant of the wires 3.

Figure 5A:
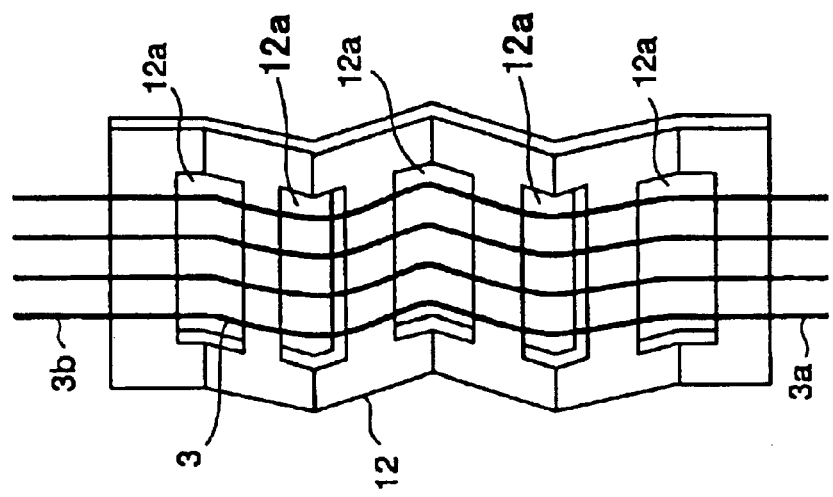
FIGS. 5A and 5B are oblique views showing a modification of the contactor of FIG. 4.
Figure 5B:
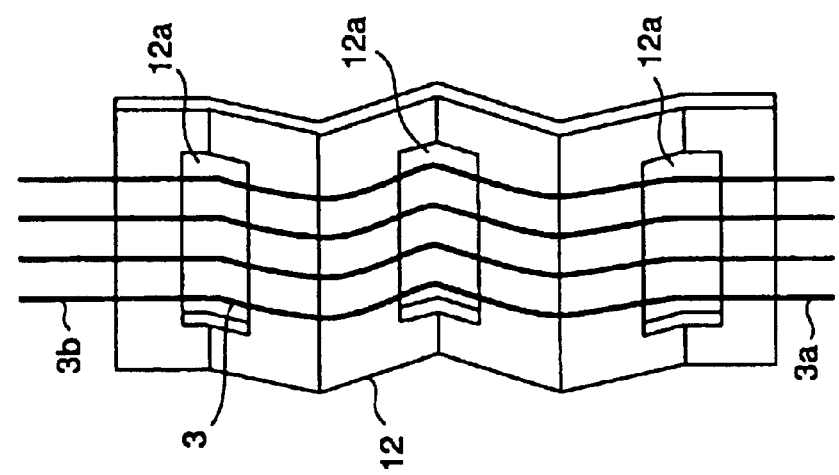

FIGS. 5A and 5B are oblique view diagrams showing a contactor 11A according to a further modification of the contactor 11 of FIG. 4.

Figure 6:
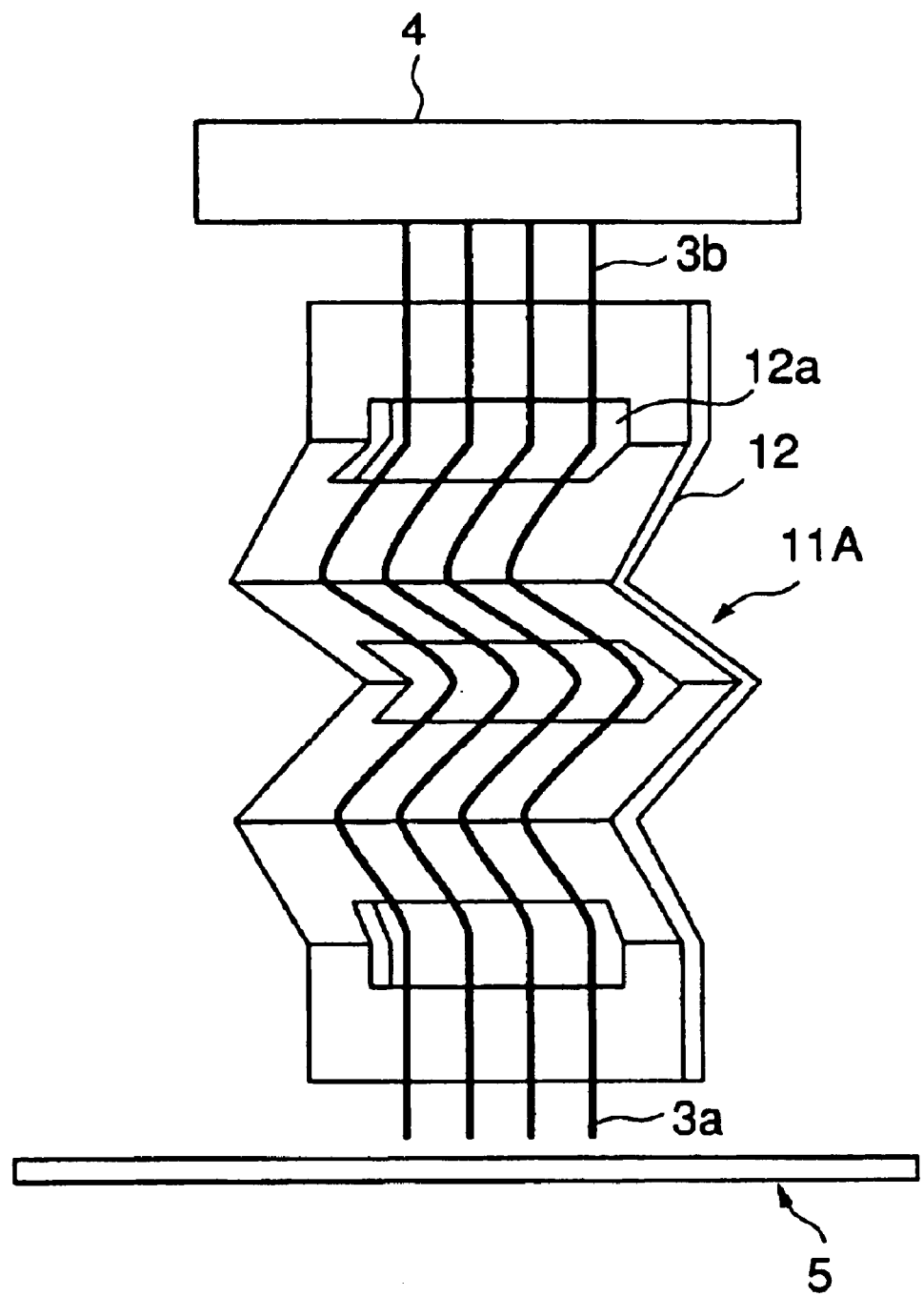
FIG. 6 is an oblique view showing a state in which the contactor of FIG. 5A was is disposed between a probe substrate and an electronic component.

Referring to FIG. 5A, there is provided an opening 12a in the substrate 12 in the contactor 11A of FIG. 5A. It should be noted that the opening 12a is formed in the part of the substrate 12 that undergoes syncline-mode deformation such that the wires 3 are bent inwardly. More specifically, the opening 12a is provided to the substrate in correspondence to the part in which occurs accumulation of compressive strain and associated deformation in the substrate 12. Thus, by cutting out the substrate 12 in correspondence to such a part, the deformation of the substrate 12 is substantially facilitated. Further, as shown in FIG. 6, the wires 3 can deform or deflect freely without being constrained by the substrate 12 at the part where the opening 12a is provided. Therefore, the substrate 12 and the wires 3 are deflected smoothly without applying unusual force to the wires 3, and the overall spring constant of the contactor can be reduced. Of course, it is possible to provide the opening 12a to all of the deflection part as shown in FIG. 5B.

(THIRD EMBODIMENT)

Next, a third embodiment of the present invention will be explained with reference to FIG. 7.

Figure 7:
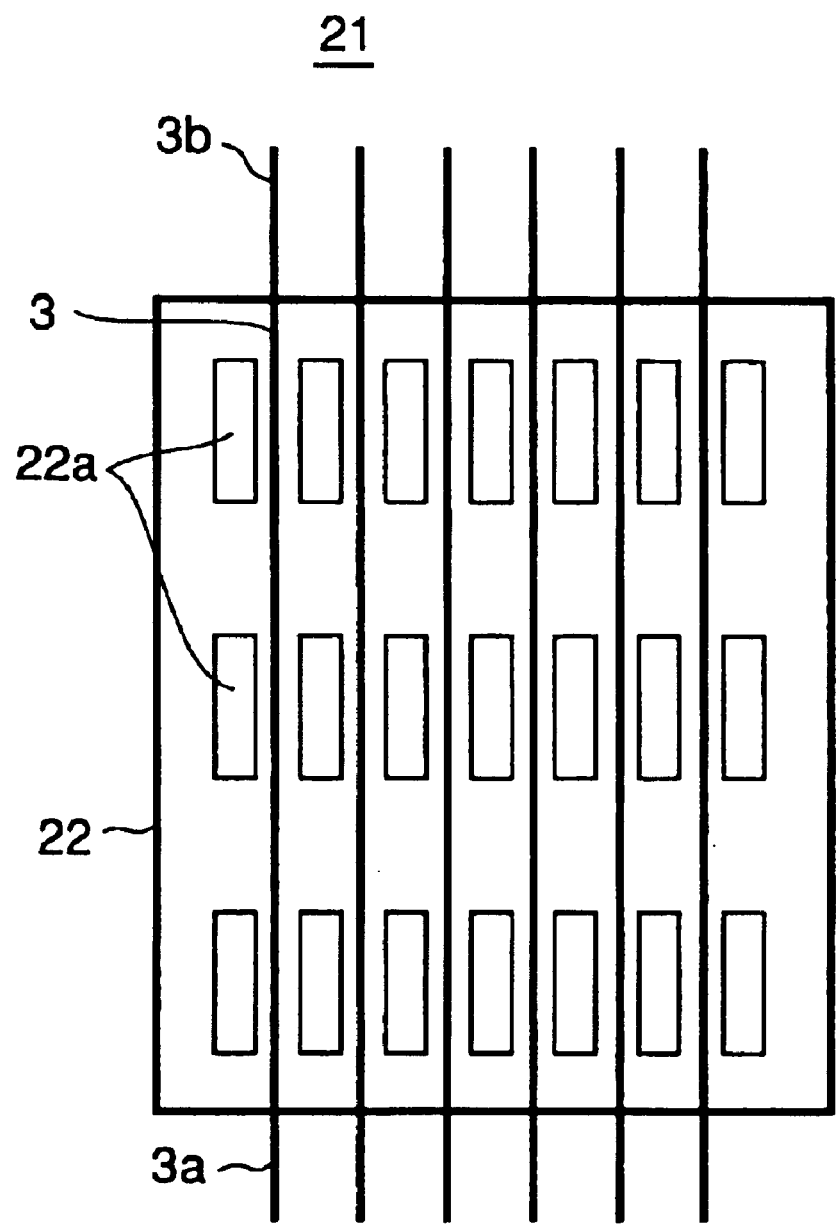
FIG. 7 is a front view showing the construction of a contactor according to a third embodiment of a present invention.

FIG. 7 is a side view of the contactor according to a third embodiment of the present invention.

Referring FIG. 7, the contactor 21 of the third embodiment includes a single substrate 22 and plural wires 3 formed on the substrate 22. Further, plural openings 22a are provided in the substrate 21. In the part of the substrate 22 in which the opening 22a is provided, the rigidity of the substrate 223 is decreased, and it becomes possible to curve the substrate 21 easily together with the wires 3. In other words, the spring constant of the contactor 21 is reduced by providing the opening 22a, and the overall the spring constant of the contactor is reduced.

Figure 8:
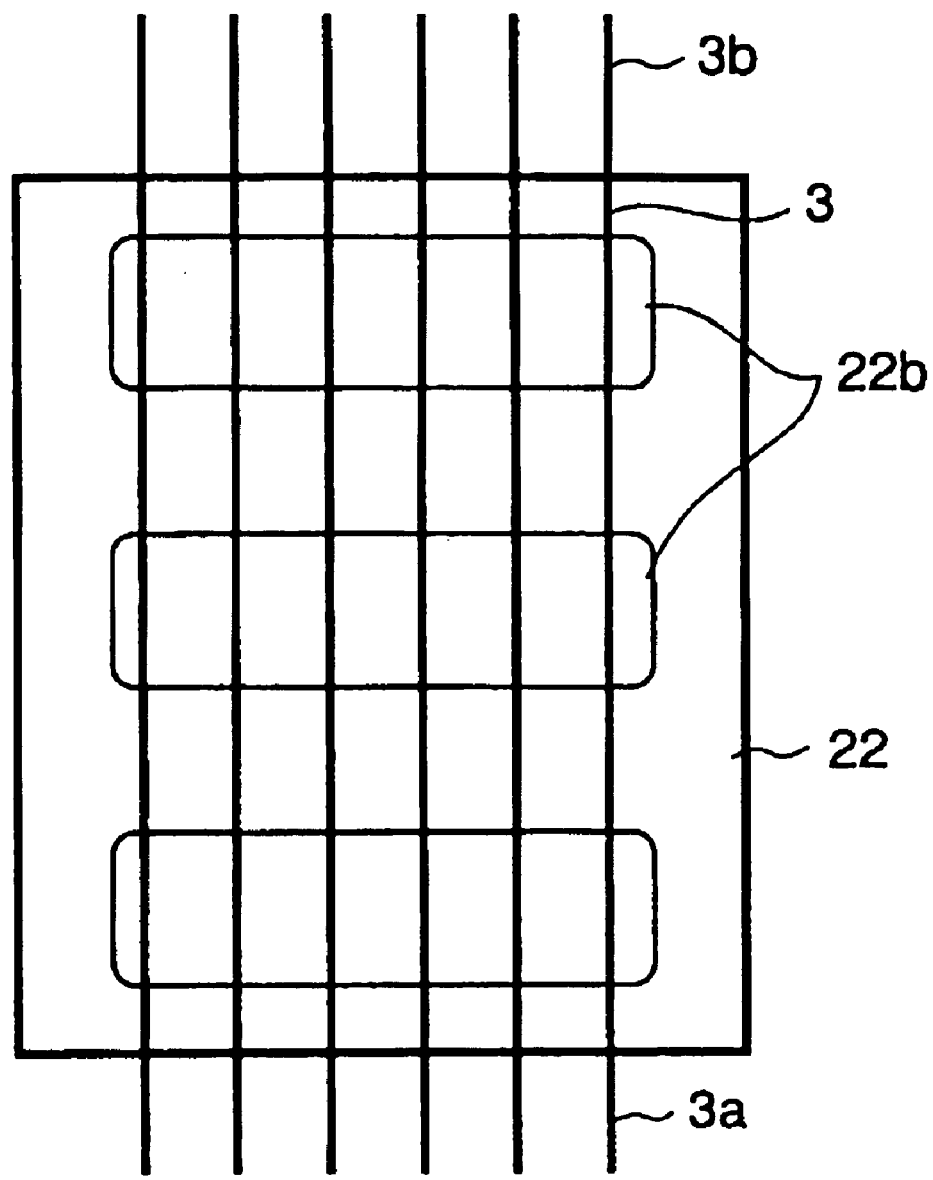
FIG. 8 is a front view showing a modification of the contactor of FIG. 7.

It should be noted that the opening 22a shown in FIG. 7 is formed near the part of the substrate 22 in which the wires 3 are formed. Thereby, the substrate 22 is left in the part on which the wires 3 are provided. As shown in FIG. 8, instead of forming the openings 22a of 7, it is also possible to form large openings 22b so as to facilitate deformation of the wires 3 further. In this case, the wire 3 can be deformed freely without constraint by the substrate 22, and the spring constant of contactor 21A can be reduced further.

(FOURTH EMBODIMENT)

Next, a fourth embodiment of the present invention will be explained with reference to FIG. 9.

Figure 9:
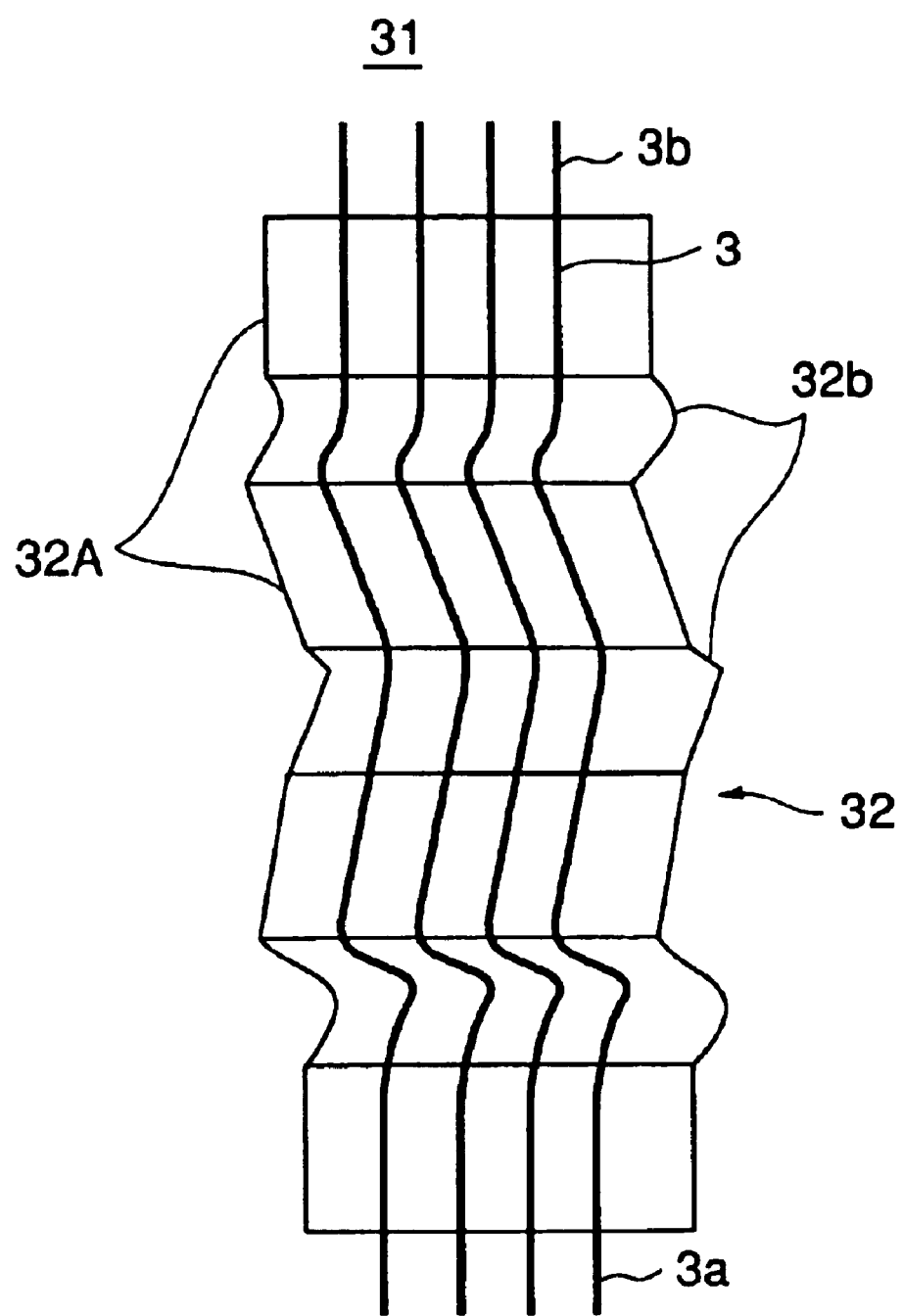
FIG. 9 is an oblique view showing the construction of a contactor according to a fourth embodiment of a present invention.

FIG. 9 is an oblique view of a contactor 31 according to a fourth embodiment of the present invention.

Referring to FIG. 9, the contactor 31 includes a substrate 21 and plural wires 3 formed on the substrate 32. The substrate 32, in turn, is formed of a first substrate part 32A and a second substrate part 32B. The first substrate part 32A is formed by a material having a relatively large rigidity while the second substrate part 32B is formed of a material having a smaller rigidity. Thus, when an urging force is applied to the contact terminals 3a and also the terminals 3b of the contactor 31, the first substrate part 32 experiences no or little deformation, while the second substrate part 32B is deformed heavily.

According to the present embodiment, the spring constant of the contactor as a whole is primarily determined by the second substrate part 32B. Further, the wires 3 are supported by the first substrate part 32A and the second substrate part 32B. Therefore, the separation of the adjacent wires 3 can be maintained constant. Contact of adjacent wires 3 can be prevented.

(FIFTH EMBODIMENT)

Next, a fifth embodiment of the present invention will be described with reference to FIGS. 10A and 10B.

Figure 10A:
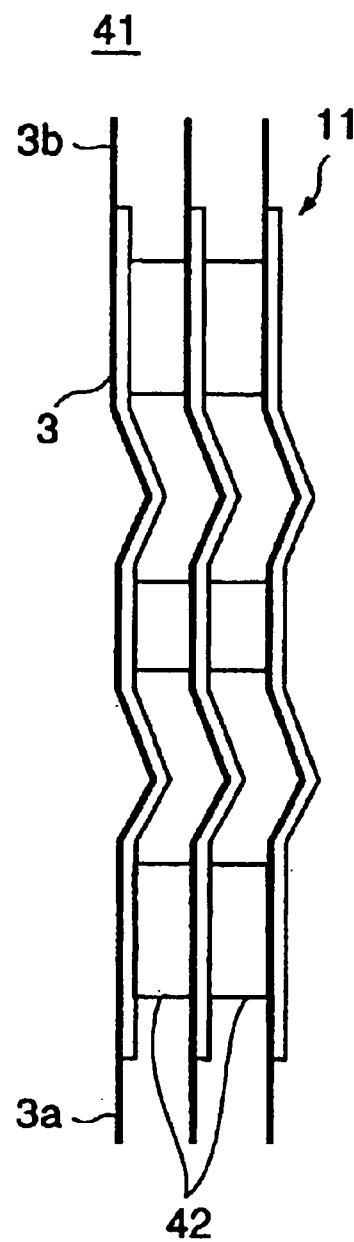
FIGS. 10A and 10B are side views of the contactor of FIG. 9 in two different states.
Figure 10B:
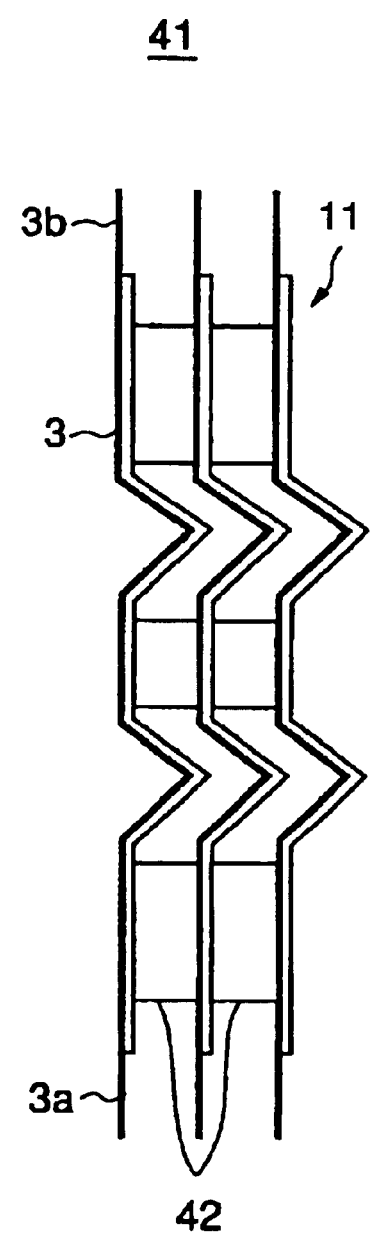

FIGS. 10A and 10B are side view diagrams of a contactor 41 according to the fifth embodiment respectively in a normal state where the contactor 41 is not deformed and in a deformed state in which the contactor 41 is deformed.

Referring to FIGS. 10A and 10B, the contactor 41 is has a structure in which the contactors 11 of the second embodiment shown in FIG. 4 are overlaid with intervening spacers 42. For the spacer 42, an insulating resin material or a resin film is suitable, while any insulating material that can support two of such substrates in a mutually separated state can be used for the spacer 42. Thereby, the spacer 42 is fixed on the substrate 12 on the part that does not cause deformation.

It should be noted that the contactor 41 has plural wires 3 along the surface of the substrate 12 and a plurality of substrates 12 are stacked perpendicularly to the surface on which the wires 3 are provided. Thereby, it becomes possible to arrange the contact terminals 3a and also the contact terminals 3b in a two-dimensional, matrix state. Thereby, it becomes possible to test the semiconductor devices in which the electrode terminals are arranged in a two-dimensional array.

FIG. 11 is a side view diagram that showing a first modification of the contactor 41 shown in FIG. 10.

Referring to FIG. 11, the contactor 41A has a construction similar to that of FIGS. 10A and 10B in which the spacer 42 is replaced with a spacer 42A of wide width. By changing the width of the spacer 42 like this, it becomes possible to change the arrangement of the contactor terminals 3a and 3b of the contactor in accordance with the arrangement of the terminals 5a of the electronic component 5.

FIG. 12 is a side view diagram showing a second modification of the contactor of FIGS. 10A and 10B.

Referring to FIG. 12, the contactor 41B has a construction in which two contactors 11 are stacked with an angle by interposing spacers 42B therebetween. In other words, the spacer 42B has a narrow width in the part close to the contact terminals 3a, while the width of the spacer 42B increased toward the contactor terminals 3b. Therefore, it becomes possible to secure a large pitch for the contact terminals 3b while simultaneously making a contact with the electrodes 5a of narrow pitch.

It should be noted that, in the embodiment shown in FIGS. 10A and 10B, plural number of the contactors 11 of the second embodiment are stacked. It is of course possible to stack any of the contactors of the first embodiment, third embodiment or fourth embodiment.

In the construction in which plural contactors are overlaid via spacers, there is a possibility that the substrate may experience deformation by a thermal stress occurs in the case there is a difference of coefficient of thermal expansion between the spacer and the substrate.

In order to avoid this, it is preferable to apply a processing to the substrate as shown in FIGS. 13A and 13B.

Referring to FIG. 13A, it can be seen that there is formed a cut in the substrate 12 along the wires 3 as shown by dotted lines. Further, it is also possible to remove a part of the substrate 12 along the wires 3 with a predetermined width as shown in FIG. 13B. Thereby, the substrate 12 is divided into a plurality of substrate pieces each corresponding to a wiring pattern 3.

In the case the electronic component 5 is a semiconductor device formed on a silicon wafer, for example, it is possible to set the amount of movement of the contact terminals 3a, caused by thermal expansion of the contactor, to be equal to the amount of movement of the electrodes of the semiconductor device caused as a result of thermal expansion of the wafer, by forming the spacer 24 by silicon.

(SIXTH EMBODIMENT)

Next, a sixth embodiment of the present invention will be described with reference to FIGS. 14A and 14B.

FIGS. 14A and 14B are side views of a contactor 51 according to the sixth embodiment of the present invention, wherein FIG. 14A shows the condition in which the contactor 51 is attached to the probe substrate 4 while FIG. 14B shows the state in which the contactor 51 is urged against the electrodes 5a of the electronic apparatus 5 for making a contact.

Referring to the drawings, it should be noted that the contactor 51 is the one corresponding to the contactor 1A of FIG. 3 in which the substrate 2-2 is divided in correspondence to each of the wires 3. By doing so, it becomes possible that each contact terminal 3a can urge the corresponding electrode 5a individually. Even in the case there is a variation in the height of the electrodes of the electronic apparatus 5, the deformable part 3c is extended in each of the wires 3 as shown in FIG. 14B, and it becomes possible to achieve an appropriate contact for all of the electrodes 5a by the contact terminals 3a.

Next, expiation will be made on the production process of the contactor 1 with reference to FIGS. 15A–18B.

Figure 15B:
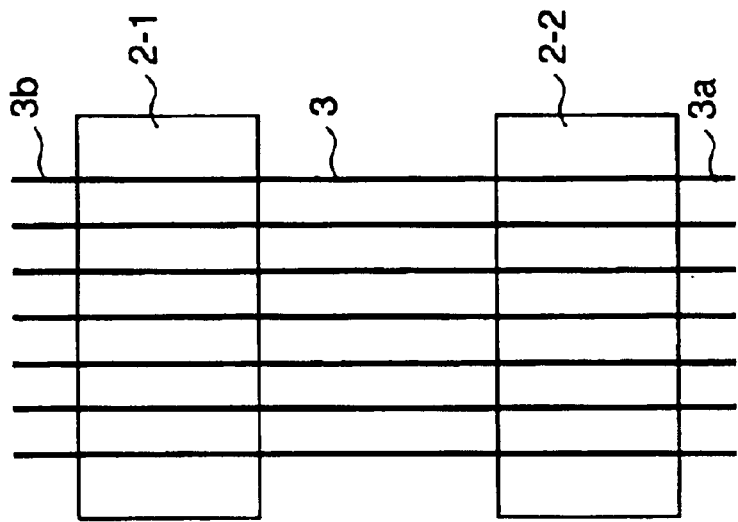
FIGS. 15A and 15B are diagrams explaining a process of making the contactor of FIG. 1.
Figure 15A:
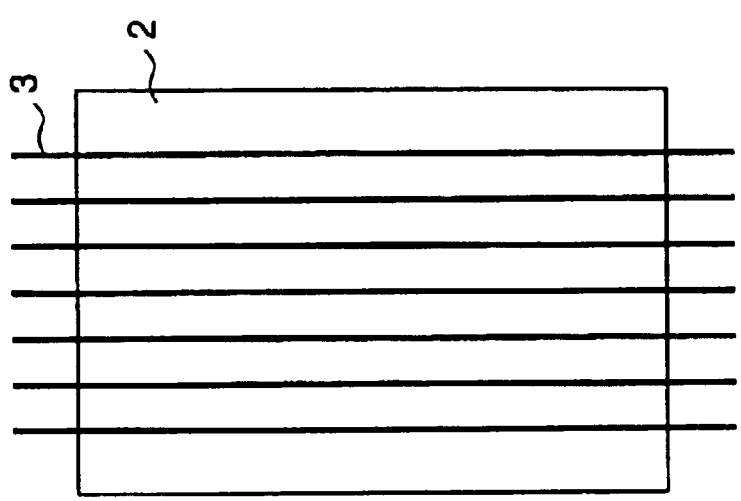

The first method of producing the contactor 1 includes the step of forming the wires 3 on the substrate 12 as shown in FIG. 15A. Further, the central part of the substrate 12 is removed thereafter as shown in FIG. 15B.

Figure 16A:
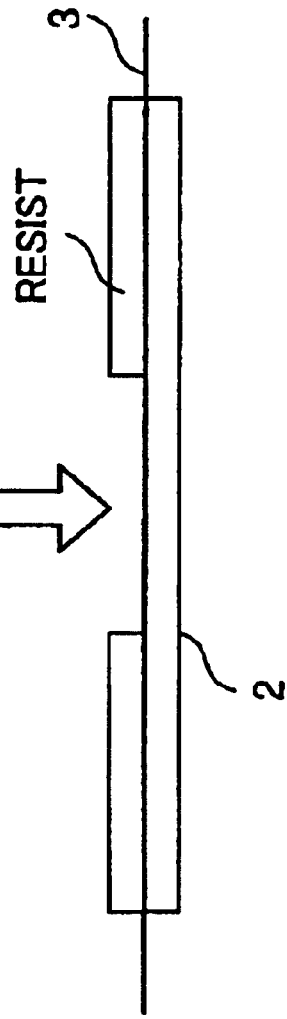
FIGS. 16A and 16B are diagrams explaining a process of making of the contactor of FIG. 1.
Figure 16B:
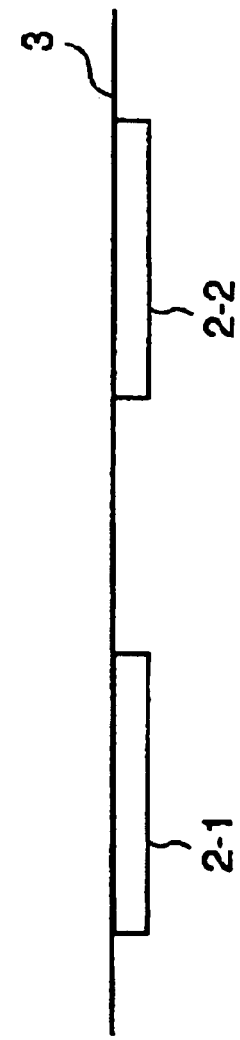

Next, in the step of FIG. 16A, a resist is provided on the substrate 3 carrying the wires 3, and the resist is removed from a part where the substrate 2 is to be removed. Further, the substrate 2 is removed by conducting an etching process or laser irradiation process at the part not covered by the resist. As a result, the contactor 1 is obtained as represented in FIG. 16B.

The second process of forming the contactor 1 is to divide the substrate 1 into two pieces and then provide the wires 3 as represented in FIGS. 17A and 17B. As shown in FIG. 18A, the substrate 12 is punched by using a mold into two separate pieces 2-1 and 2-2, and the wires 3 are provided so as to bridge the substrates 2-1 and 2-2 as represented in FIG. 18B. In this case, the wires 3 may be formed of a copper wire, and the like.

FIGS. 19A and 19B are diagrams explains the process of producing the contactor 1A of FIG. 3.

Referring to FIG. 19A, the wires 3 are formed on the substrate 2 at first. It should be noted that such wires 3 include a deformable part 3c of zigzag form, wherein such wires can be formed easily by etching a copper sheet attached on the substrate 2 by conducting an etching process.

Next, in the step of FIG. 19B, the substrate 2 is separated into the substrates 2-1 and 2-2 according to the process similar to that of FIGS. 16A and 16B, and the contactor 1A is obtained.

FIGS. 20A and 20B show the example of the case in which the deformable part of the contactor 1A is formed to have an S-shaped form. The process itself is the same as in the process of FIGS. 19A and 19B.

Figure 21:
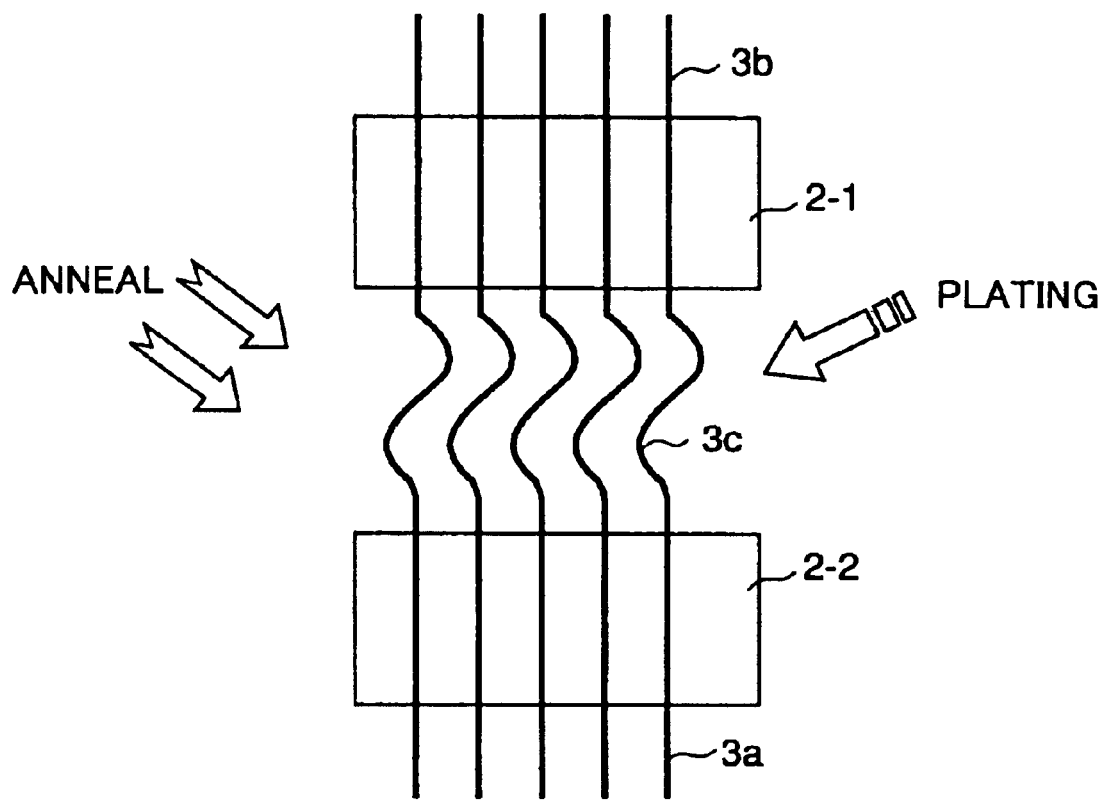
FIG. 21 is a diagram showing an example of applying a heat treatment to the deformable part in the contactor of FIG. 20B.

FIG. 21 is a diagram showing the case of applying a thermal treatment or plating process to the deformable part 3c of the wires 3 for the case of the contactor of FIGS. 20A and 20B. By applying a heat treatment, or alternatively a plating process of nickel (Ni), palladium (Pd), nickel alloy, and the like, to the deformable part 3c of the wires 3, it becomes possible to adjust the resiliency of the deformable part 3c and hence the spring constant of the contactor.

Figure 22:
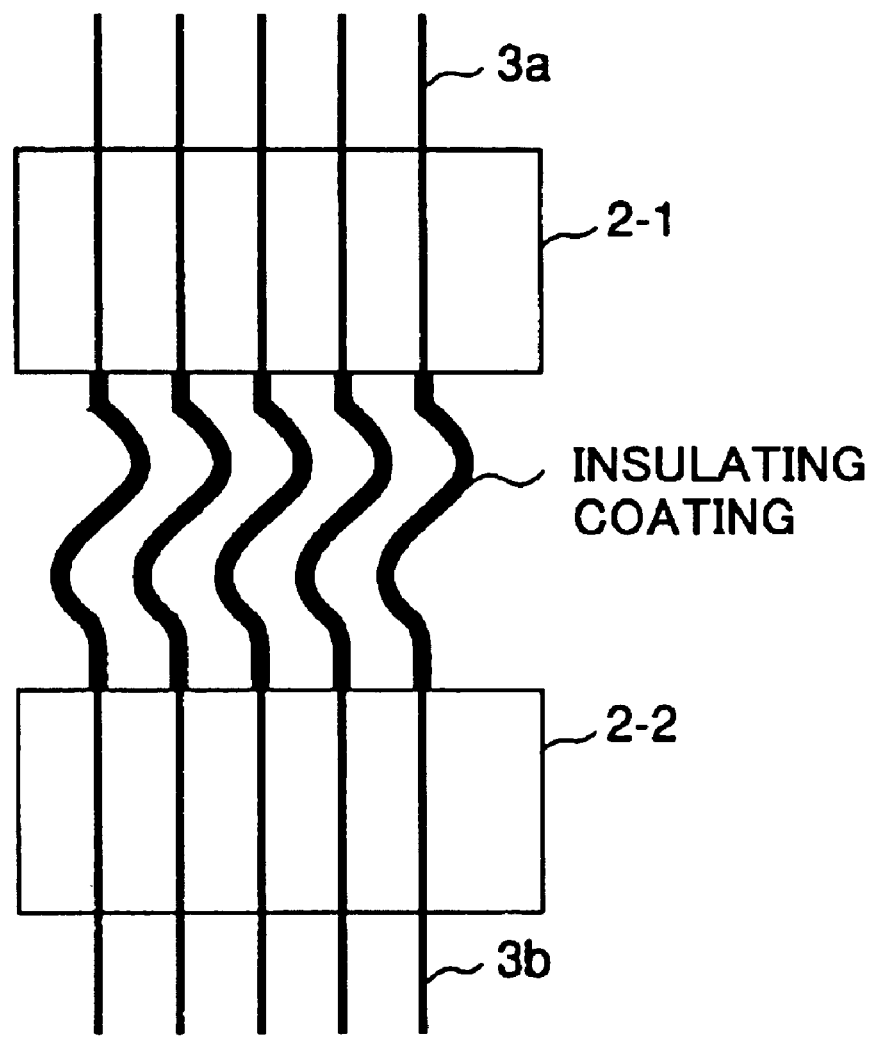
FIG. 22 is a diagram showing an example of providing an insulation coating on the deformable part of the contactor shown in FIG. 20B.

FIG. 22 is a diagram showing the process of applying an insulation coating of polyimide resin, and the like, on the deformable part 3c of the wires 3 for the case of the contactor of FIGS. 20A and 20B. By applying an insulation coating, it becomes possible not only to adjust the resiliency of the deformable part but also to eliminate short-circuit even in the case the deformable parts 3c are contacted with each other.

Figure 23:
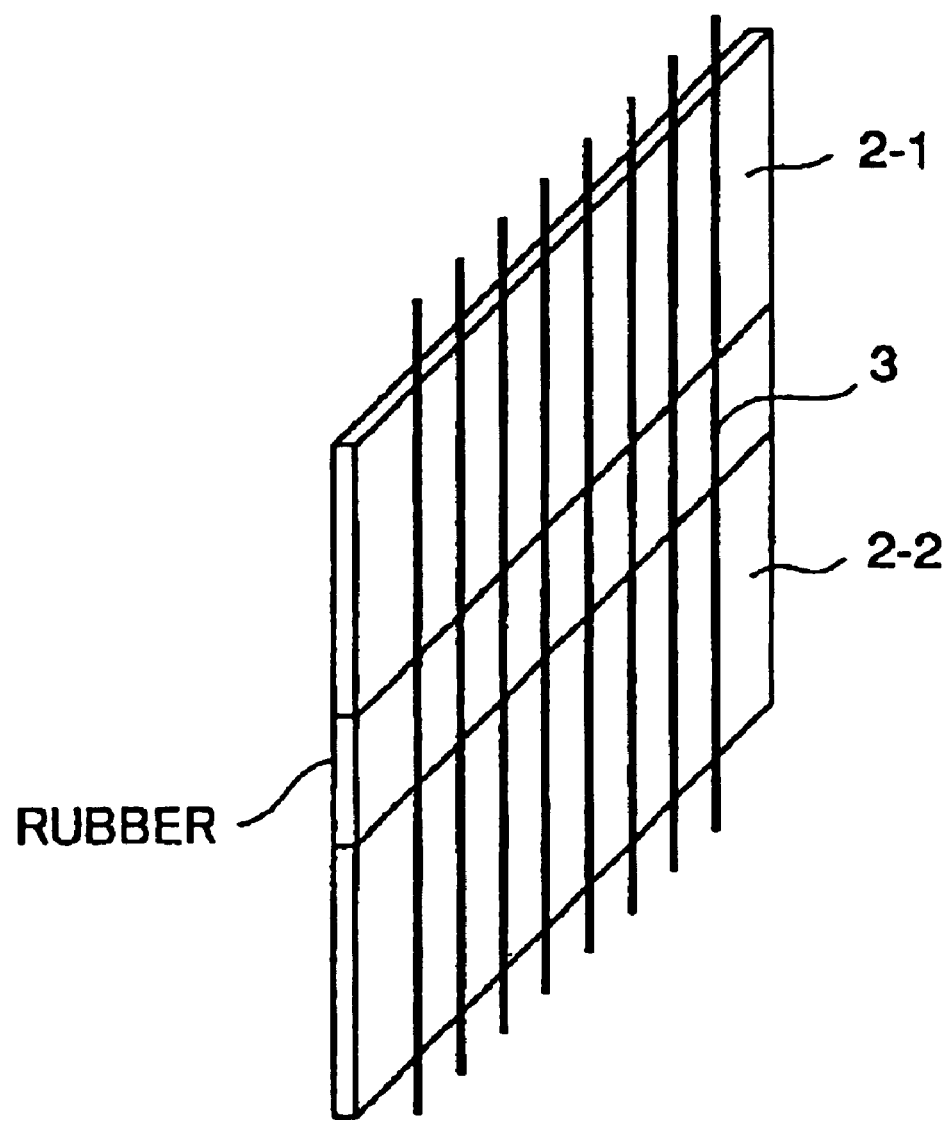
FIG. 23 is an oblique view showing a modification of the contactor of FIG. 1.
Figure 24:
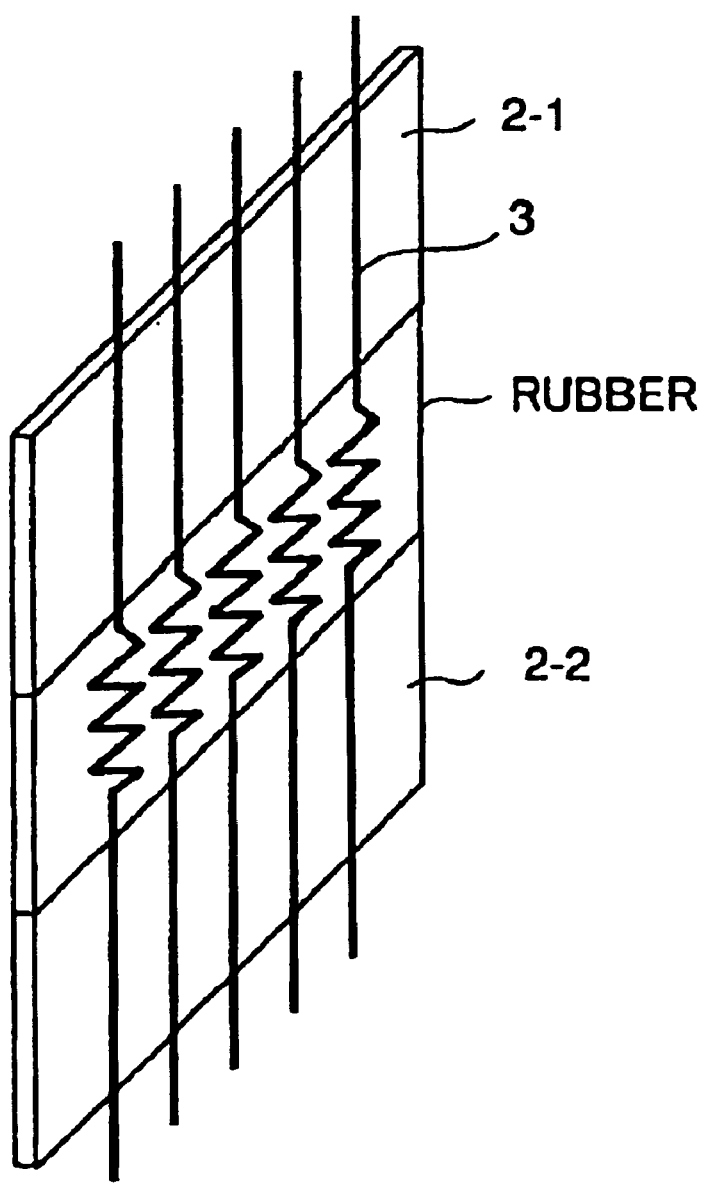
FIG. 24 is an oblique view showing a modification of the contactor of FIG. 3.

FIG. 23 shows a modification of the contactor 1 in which the gap between the substrates 2-1 and 2-1 is filled with an elastic rubber resin such as a silicon rubber. Also, FIG. 24 shows an example similar to FIG. 22 in which the gap between the substrates 2-1 and 2-2 of the abovementioned contactor 1A is filled with an elastic rubber resin like a silicon rubber. By filling the gap between the substrates 2-1 and 2-2 with the elastic rubber resin, it becomes possible to support the wires 3 while simultaneously insulating the same from one another. Thereby, it becomes possible to prevent contacting of the wires 3 with each other.

(SEVENTH EMBODIMENT)

Next, a seventh embodiment of the present invention will be explained.

Figure 25:
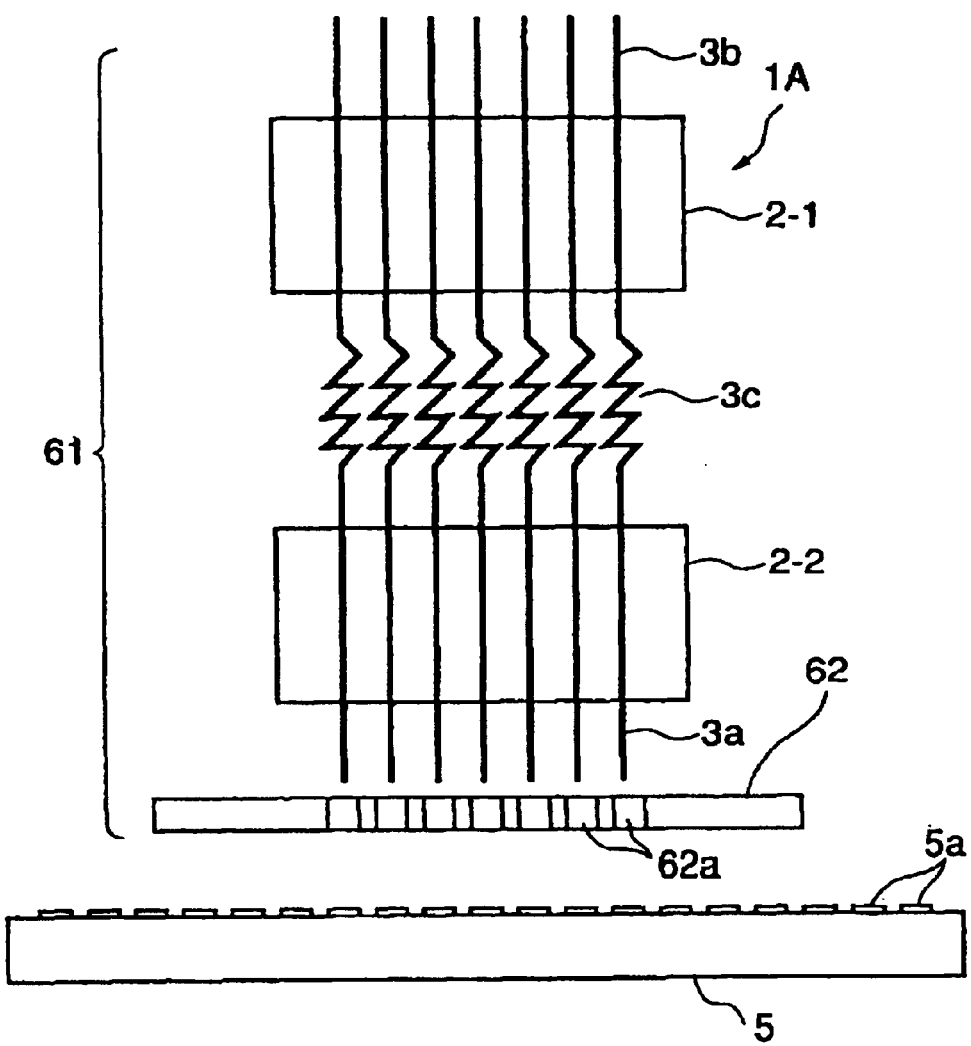
FIG. 25 is a front view explaining the principle of a contactor according to a seventh embodiment of the present invention.

FIG. 25 is a front view diagram explaining the principle of the contactor according to a seventh embodiment of the present invention.

Referring to FIG. 25, the contactor 61 shown in FIG. 25 is formed of the contactor 1A shown in FIG. 3 and a contact terminal guide 62. The contact terminal guide 62 has guide holes 62a each being inserted with a corresponding contact terminal 3a of the contactor 1A. The contact terminal guide 62 is disposed in the vicinity of the electrodes 5a of the electronic component 5 to be tested and guides the contact terminals 3a so that each terminal 3a makes a correct contact with the corresponding electrode 5a of the electronic component 5. Thus, the guide holes 62a are provided in the contact terminal guide 62 with the same arrangement of the electrodes of the electronic component 5, and the contact terminals 3a are positioned correctly in correspondence to the electrodes 5a of the electronic component 5 by being inserted into the corresponding guide holes 62a.

Figures 26A, 26B:
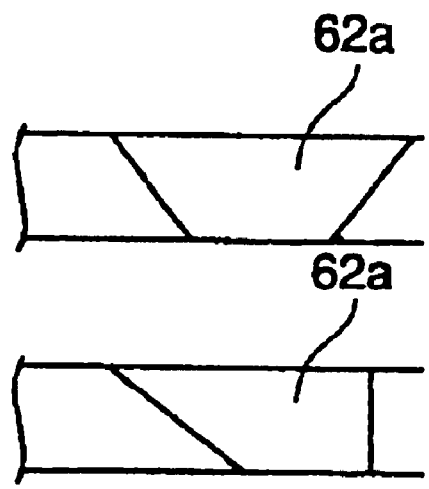
FIGS. 26A and 26B are cross-sectional view showing the form of a guide hole.

FIGS. 26A and 26B are cross-sectional diagrams showing the form of the guide hole 62a.

Referring to FIG. 26A, it can be seen that the guide hole 62a has sloped surfaces at both lateral sides thereof. On the other hand, the guide hole 62a shown in FIG. 25B has a sloped surface on one side thereof. These sloped surfaces facilitate the insertion of the contact terminals 3a and achieve an accurate positioning of the contact terminals 3a.

FIG. 27 is a front view showing the contactor 61 in the state that the contactor 61 is attached on the probe substrate 4.

Referring to FIG. 27, the substrate 2-1 of the contactor 1A is attached to the probe substrate 4 by a support mechanism. In addition, the terminal guide 62 is attached to the probe substrate by the support mechanism 63. In the state that the contactor 1A and the contact terminal guide 62 are attached to the probe substrate 4, the contact terminals 3b of the contactor 1A make a contact to corresponding electrodes 4a of the probe substrate. Thereby, it should be noted that the contact terminals 3a extend by penetrating through the corresponding guide holes 62a of the guide 62. The top end of the contact terminals 3a protrudes slightly from the guide hole 62a.

FIG. 28 is a diagram showing the example in which the contact terminal guide 62A is formed of a material identical with the silicon wafer or a material having a generally identical coefficient of thermal expansion, for the case in which a semiconductor device formed on a silicon wafer is used as the electronic component 5 to be tested.

For example, the contact terminals 3a and the electrodes 5a may be displaced relatively with each other at the time of high temperature test such as the burn-in test when there is a large difference of coefficient of thermal expansion between the electronic component (silicon wafer) and the substrate 2-2 of the contactor 1A.

Thereby, there may be a problem in that the contact terminal 3a misses the electrode 5a. When the contact terminal guide 62 A is formed with the material having the same material of the electronic component (silicon wafer) or a material having a similar coefficient of thermal expansion, the amount of displacement with the thermal expansion becomes identical and the problem of relative displacement of the contact terminals 3a and the electrodes 5a disappears. Thereby, it becomes possible to align the contact terminals 3a with the corresponding electrodes 5a.

Hereinafter, examples of changing the material of the contact terminal guide according to the test body will be explained with reference to FIGS. 29, 30 and 31.

The example of FIG. 29 shows the case in which the electronic component 5 is a wafer level CSP and the contact terminal guide 62B is formed with a material having a coefficient of thermal expansion equivalent to that of the seal material or coating material of the wafer level CSP. The seal material of wafer level CSP includes a mold resin of a package, a polyimide resin coating, a wire substrate, and the like.

The example of FIG. 30 represents the case in which the electronic component 5 is a semiconductor device was attached to a dicing film and the contact terminal guide 62C is formed of a material having a coefficient of thermal expansion equivalent to that of the dicing film. The dicing film is formed of a comparatively cheap material of polyethylene and generally has a relatively large coefficient of thermal expansion.

Figure 31:
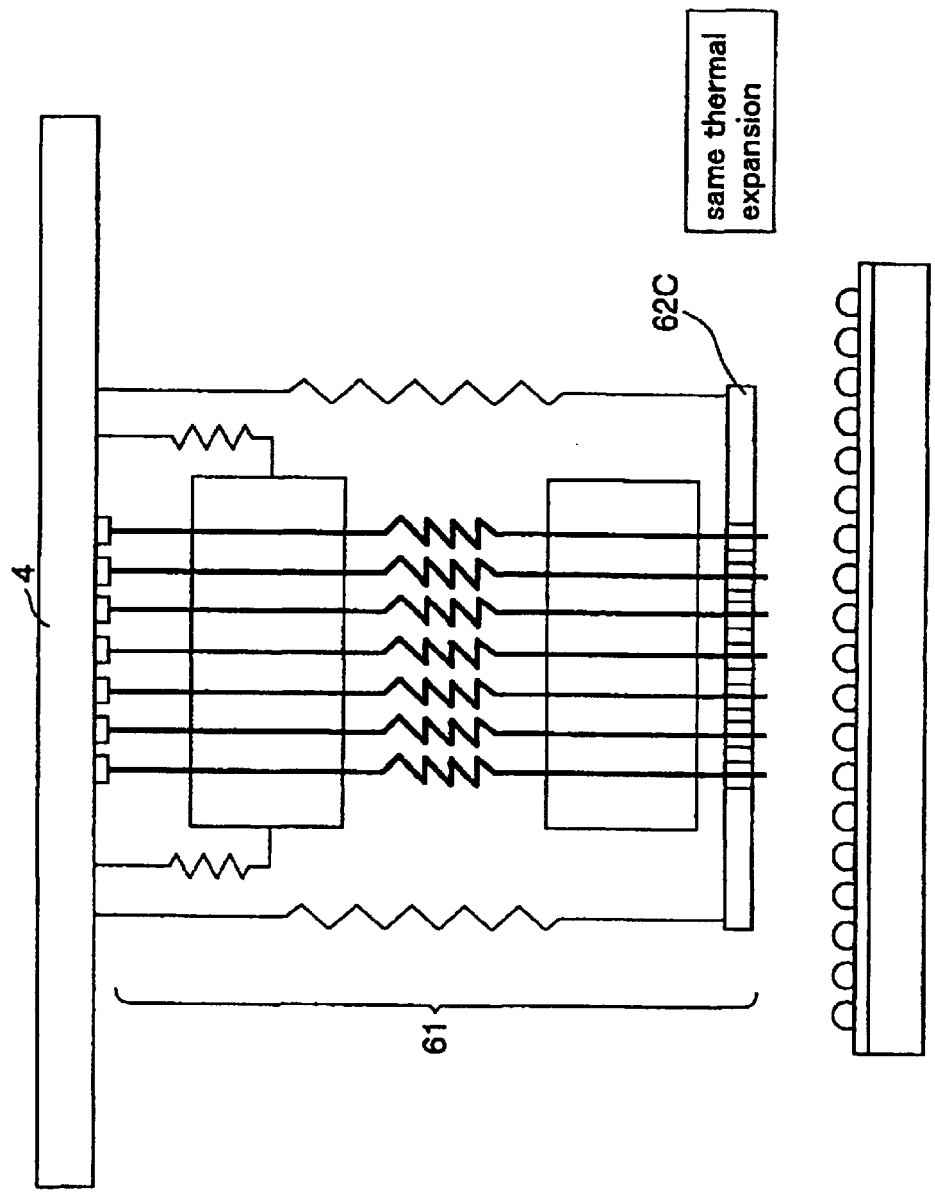
FIG. 31 a diagram showing an example of forming the contact terminal guide with a material having a coefficient of thermal expansion equivalent to that of a seal material of a semiconductor package.

The example of FIG. 31 represents the case in which the electronic component 5 is a package semiconductor device formed of a simultaneous molding process. In the case of FIG. 31, the contact terminal guide 62D is formed of a material having a coefficient of thermal expansion equivalent to that of the seal material or base material of the package semiconductor device.

For example, the base material of the package semiconductor device may be formed of a printed wire board, a TAB substrate, a ceramic substrate, and the like.

By properly selecting the material forming the contact terminal guide such that the contact terminal guide has a coefficient of thermal expansion equivalent to that of the test body as noted above, the problem of positional offset of the contact terminals 3a by the thermal expansion effect is prevented and the test can be conducted with high reliability.

Figure 32A:
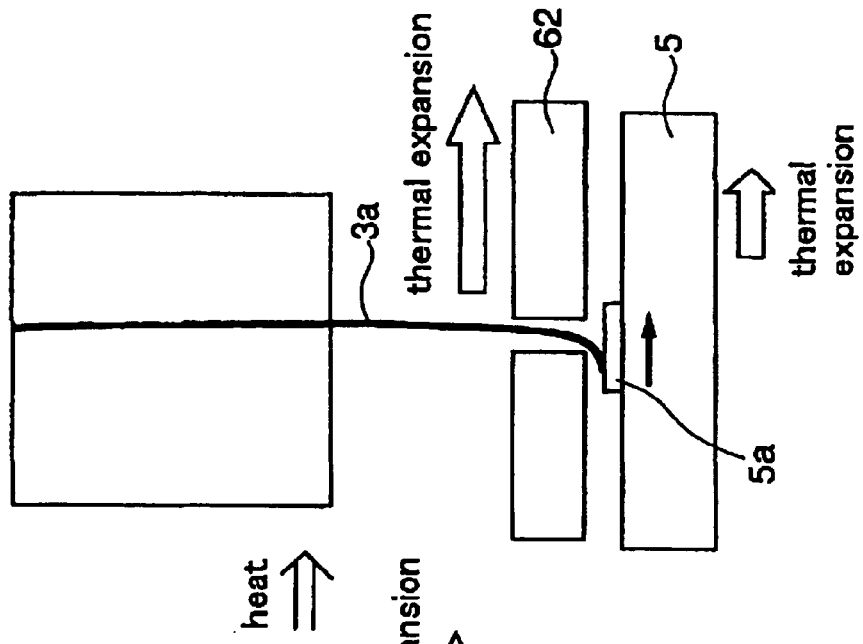
FIGS. 32A and 32B are diagrams explaining a movement of a contact terminal on an electrode caused by thermal expansion.
Figure 32B:
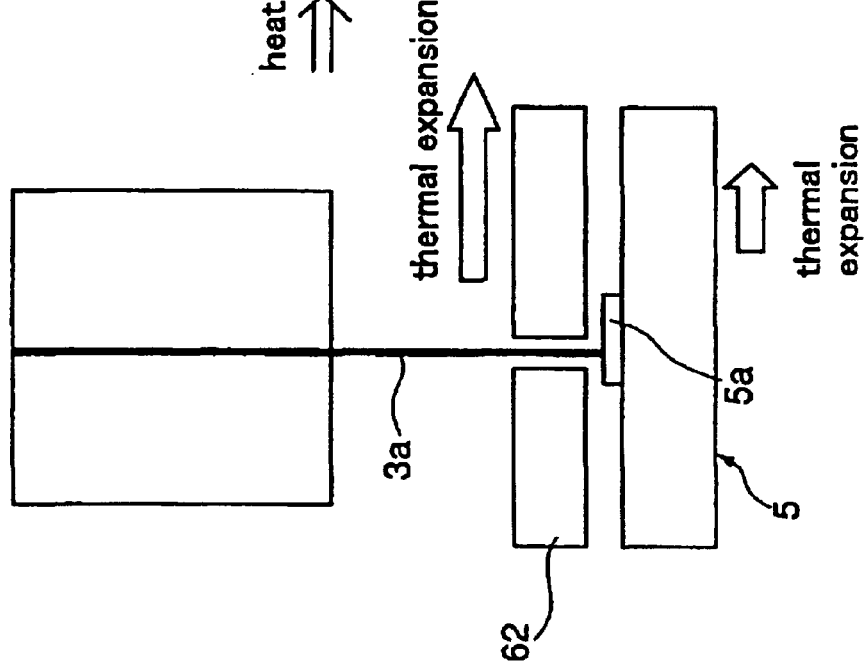

By changing the coefficient of thermal expansion of the contact terminal guide with regard to the coefficient of thermal expansion of the test body, on the other hand, it is possible to achieve the effects as follows. In the case the coefficient of thermal expansion of the contact terminal guide 62 is set to be larger than the coefficient of thermal expansion of the electronic component 5 used for the test body as shown in FIG. 32A, for example, there occurs a movement of the contact terminals 3a on the electrodes 5a as a result of difference of the coefficient of thermal expansion as represented in FIG. 32B. With this movement of the contact terminals 3a, it is possible to attain the effect of reducing the contact resistance between the contact terminal 3a and the electrode 5a, by breaking the natural oxide film and the like formed on the contact electrode 5a. Also, a similar effect can be achieved also in the case the coefficient of thermal expansion of the contact terminal guide 62 is smaller than the coefficient of thermal expansion of the electronic component 5.

FIGS. 33A and 33B are diagrams explaining the form of the guide hole 62a shown in FIGS. 26A and 26B, wherein FIG. 33A is a diagram showing the guide hole 62a as viewed from the top direction while FIG. 26B is a diagram explains the guide of contact terminal 3a.

Viewing from the direction of the electronic component 5, the guide hole 62a is an elongated hole and a slope surface 62b is extending from an end part thereof. Thereby, it should be noted that a contact terminal 3a is adjusted so as to locate right over a corresponding electrode 5a of the electronic component 5 and makes a contact with the electrode 5a by descending from the state illustrated in FIG. 33B.

Now, when the position of the contact terminal 3a is offset slightly and the contact terminal 3a hits the slope surface 62b, the tip end of the contact terminal 3a is eventually guided to the electrode 5a by sliding along the slope surface 62b.

Figure 34:
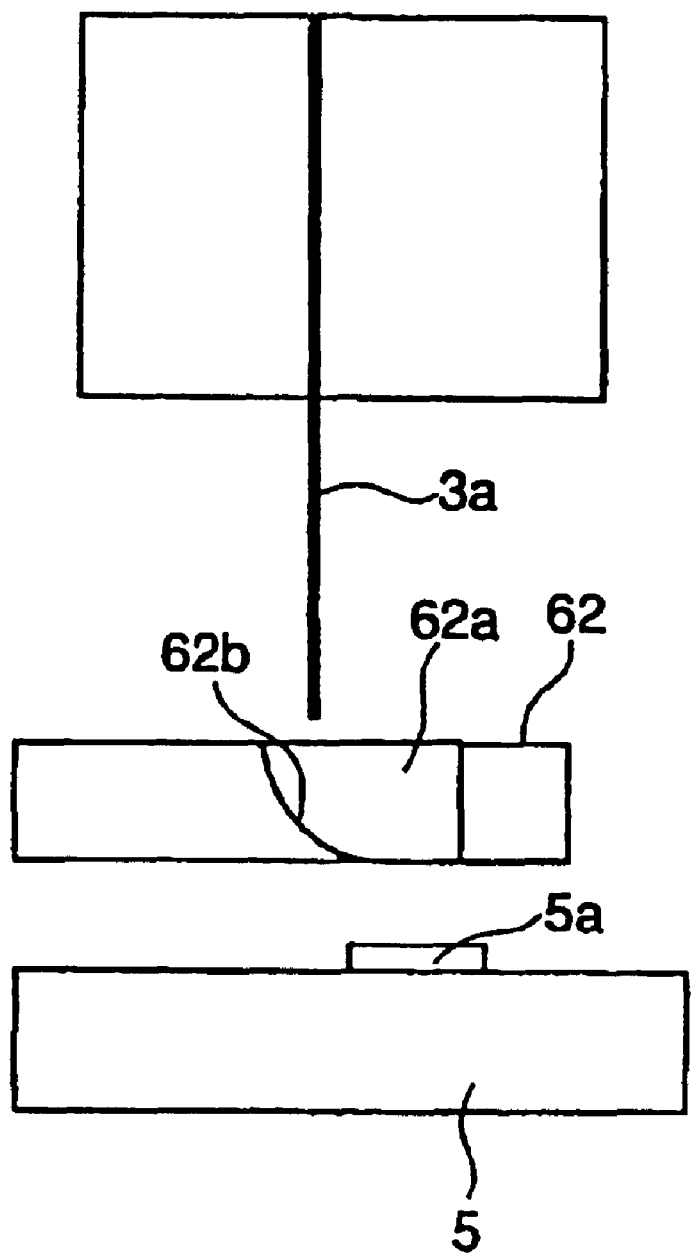
FIG. 34 is a diagram showing a guide hole having a curved slope surface.

Furthermore, it should be noted that the slope surface 62b is not limited to a flat surface but may be a curved slope surface as shown in FIG. 34. Further, it is also possible to provide a curved slope surface 62b so as to surround the guide hole as shown in FIGS. 35A and 35B.

FIGS. 36A–36C are diagrams explaining the effect of the abovementioned slope 62b.

As shown in FIG. 36A, there may be formed a deposit on the tip end of the contact terminal 3a, wherein the deposit is removed from the contact terminal as a result of the tip end of the contact terminal 3a sliding along the slope surface 62b as shown in FIG. 36B. Thus, as shown in FIG. 36C, the tip end of the contact terminal 3a, from which the deposits have been removed, is guided with certainty to the electrode 5 and achieves an excellent contact.

Next, various modifications and applications of the contactors of the abovementioned embodiment will be explained.

Figure 37:
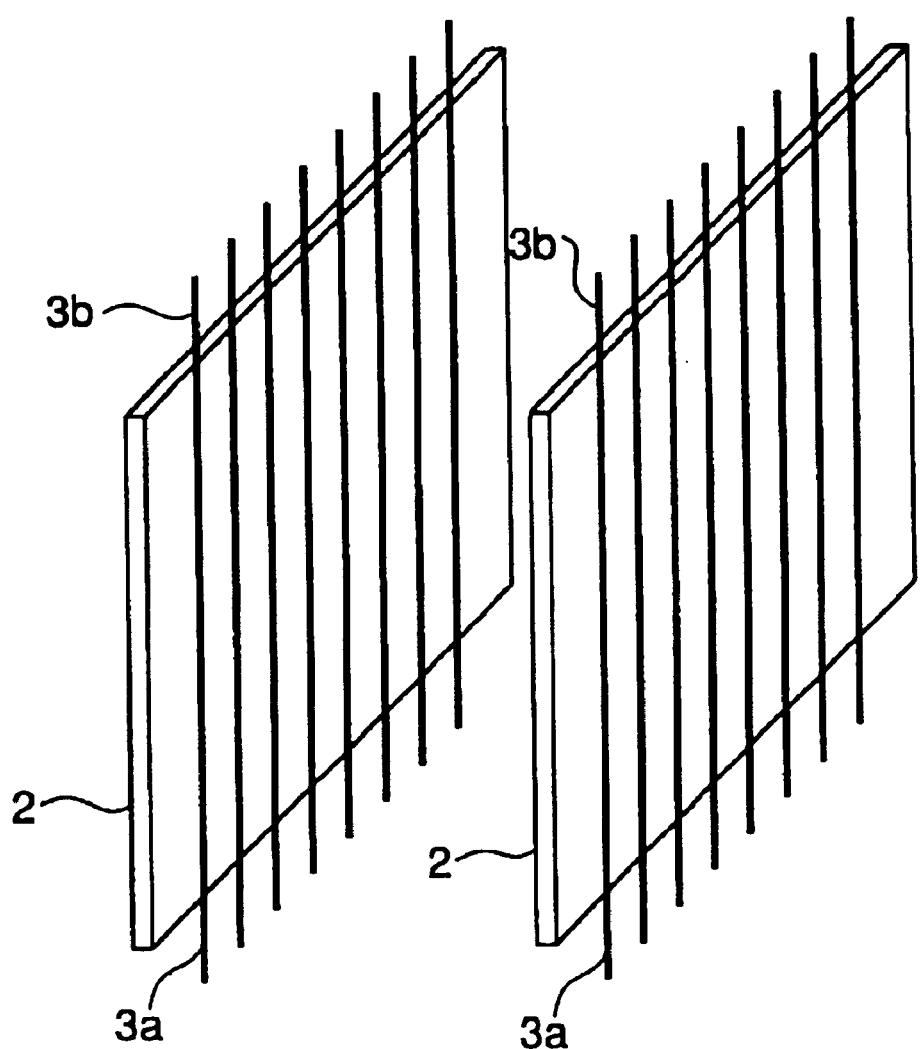
FIG. 37 is a diagram showing the construction of a contactor in which the contactor has two rows of contact terminals in alignment of the electrodes of an area array type semiconductor device.
Figure 38:
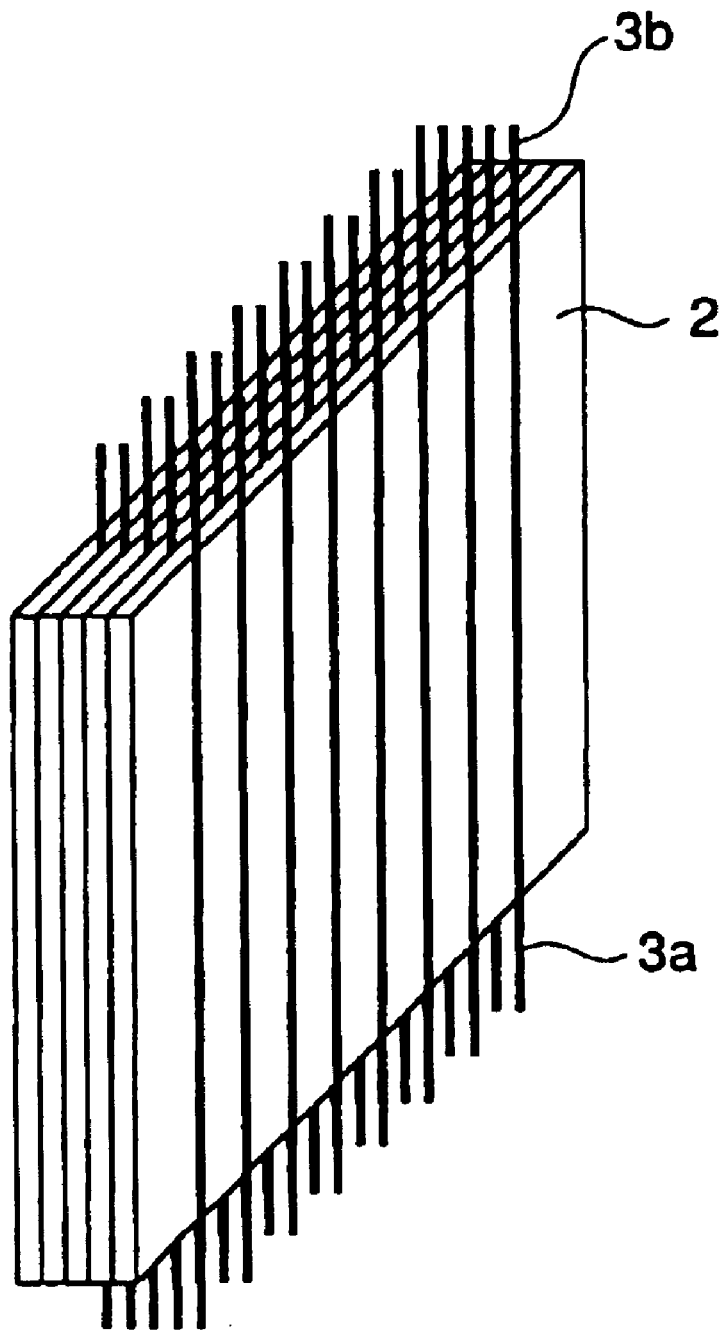
FIG. 38 is a diagram showing the construction of a contactor in which the contactor has contact terminals in alignment with the electrodes of an area array type semiconductor device.
Figure 39:
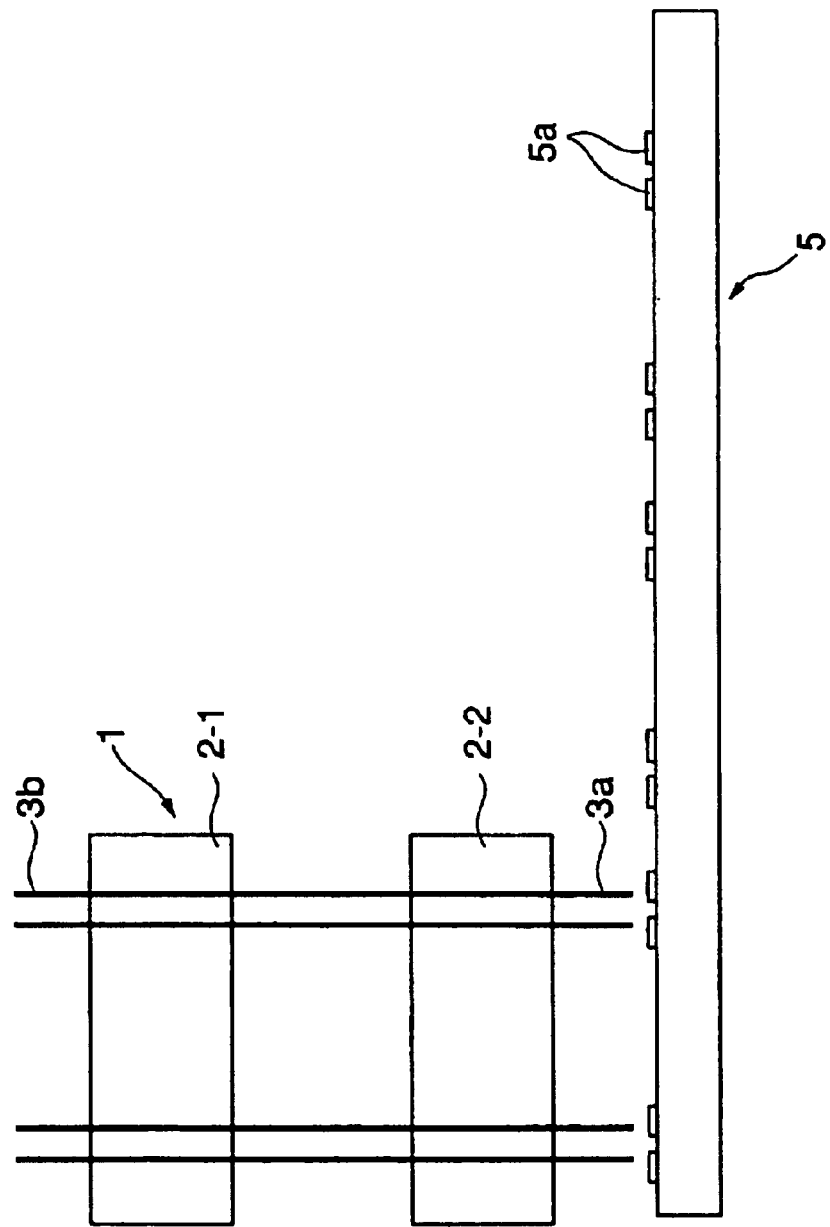
FIG. 39 is a diagram showing the construction of a contactor adapted for a semiconductor device has two rows of electrodes along a peripheral part thereof.

FIG. 37 is a diagram showing the construction in which the contactors noted above are stacked in conformity with the electrode arrangement of a peripheral type semiconductor device. FIG. 38 is a diagram showing the construction in which the contact terminals 3a are arranged in conformity with the electrode arrangement of an area array type semiconductor device. Also, FIG. 39 is a diagram showing the construction of the contactor adapted in conformity with a semiconductor device having the electrodes in two rows along a periphery thereof.

Figure 40:
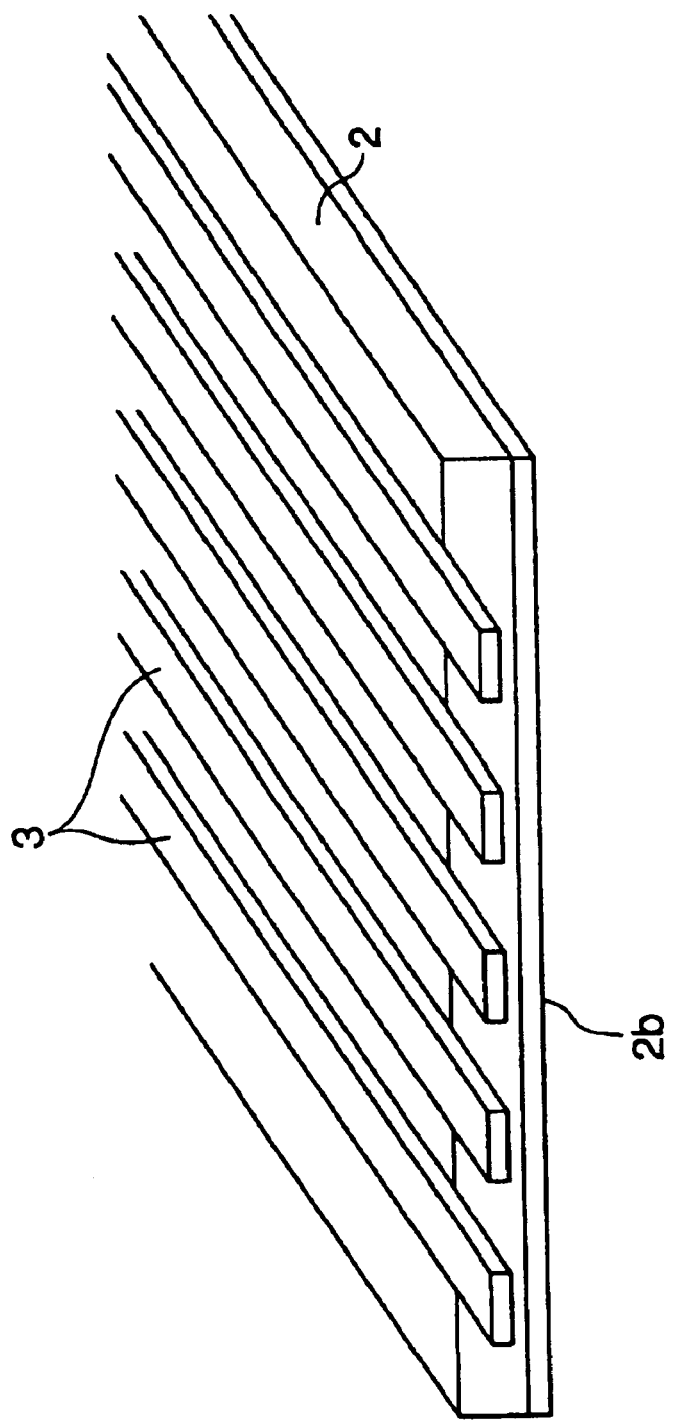
FIG. 40 is an oblique view showing the case in which the contactor has the wires in the form of microstrip line on a substrate.

FIG. 40 is an oblique view showing the example in which the wires 3 are provided on the substrate 2 in the form of a microstrip line. Thus, the substrate 2 is formed by a dielectric material and a conductor 2b formed of Cu, for example, is provided on the entirety of on surface thereof as a ground surface. Further, the wires 3 are provided on the opposite surface by a patterning process of a copper layer, for example for example. With this, a contactor suitable for testing a semiconductor device that processes a high frequency signal.

Figure 41:
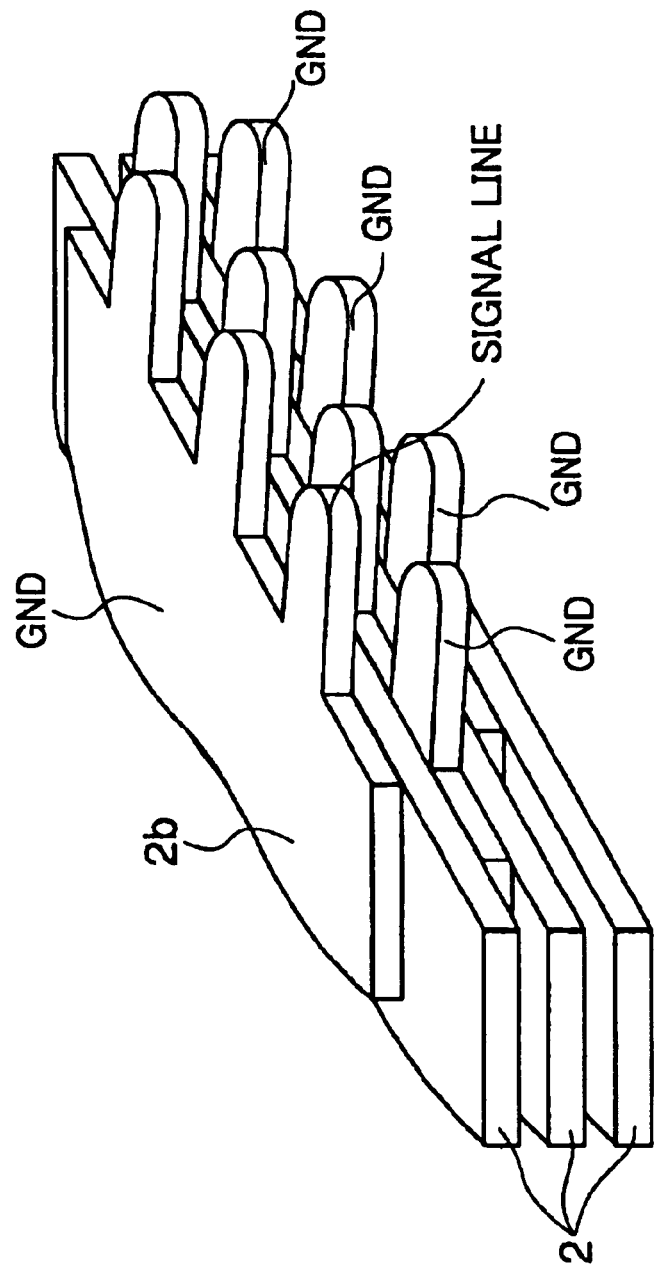
FIG. 41 is an oblique view showing a contactor in which the signal lines in the contactor are surrounded by ground wirings.

As an application of the structure shown in FIG. 40, it is also conceivable to surround the signal line of the contactor by a ground wire for improving the screening effect as shown in FIG. 41.

Figure 42:
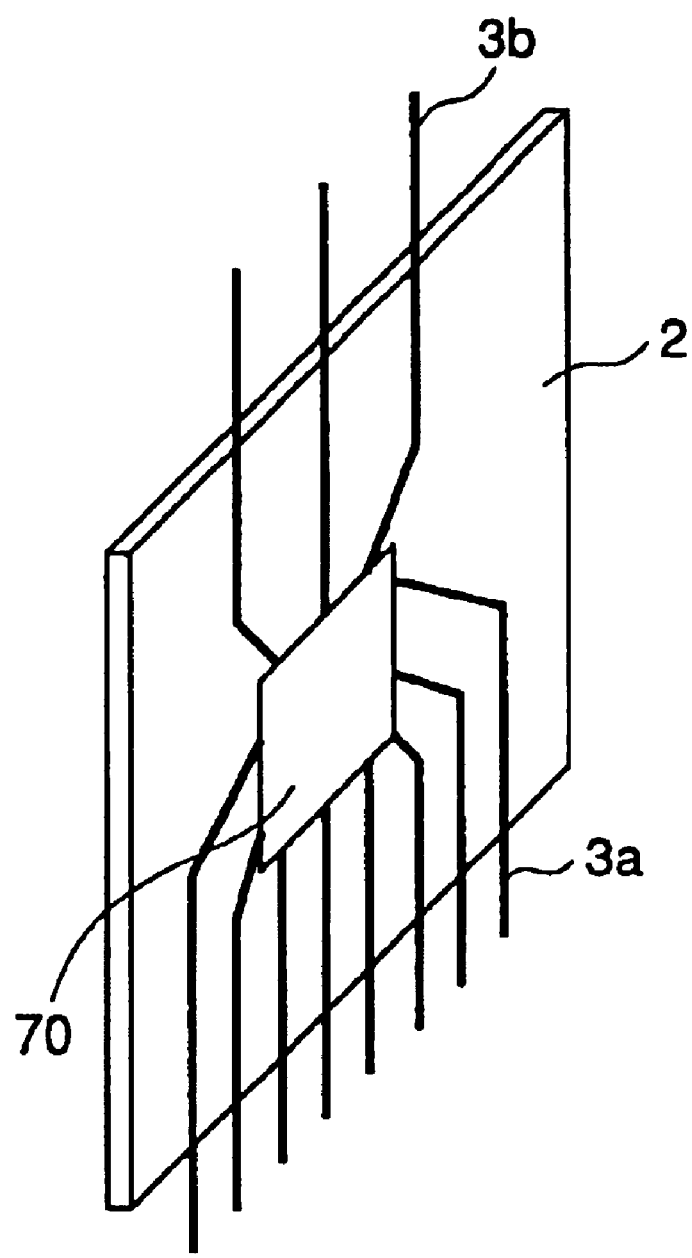
FIG. 42 is an oblique view showing an example in which an electronic component to the tested is mounted on a substrate of the contactor.

FIG. 42 is an oblique view showing an example in which a testing component 70 is mounted on the substrate 2 of the contactor. The electronic component 70 thus tested may be an A/D converter. According to such a construction, deterioration of the signal quality is prevented in the case an analog signal is supplied from the semiconductor to be tested, by converting the analog signal to a digital signal on the contactor. It is preferable to conduct such an A/D conversion in the part close to the tested body, and thus, it is preferable to provide the A/D converter on the contactor.

Figure 43:
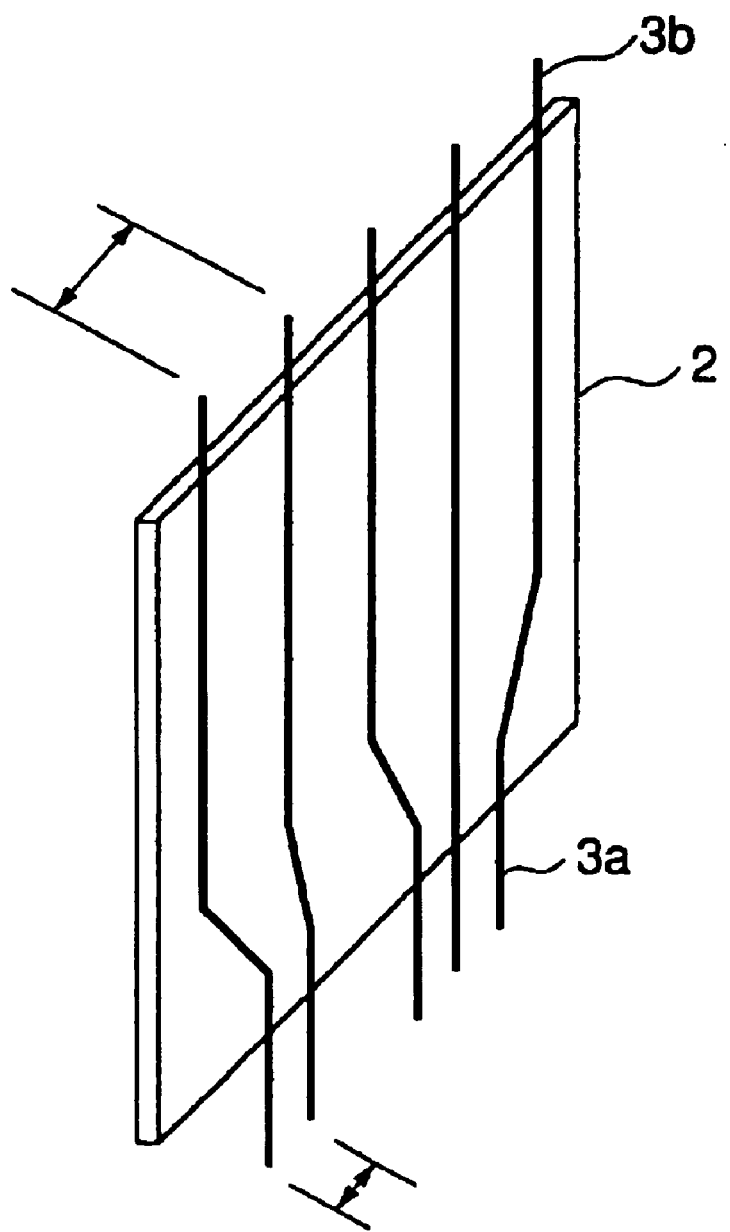
FIG. 43 is an oblique view showing the construction in which the pitch of the wires is changed on a substrate.

FIG. 43 is an oblique view showing the construction that changes the pitch of wires 3 on the substrate 2. Thus, when the wires 3 are formed on the substrate 2 by a patterning process, for example, the pitch of the contact terminals 3a at the side of the tested body is set to be smaller in conformity with the electrode pitch of the tested body. On the other hand, the pitch of the contact terminals 3b at the side of the probe substrate is increased. Such a construction can be formed quite easily by forming the wires 3 of the contactor by conducting a patterning process.

FIGS. 44A and 44B are diagrams showing the example of performing a plating processing on a tip end part of the contact terminals 3*a*. It should be noted that FIG. 44A shows the whole contactor. On the other hand, FIG. 44B is a diagram showing the part inside the circle that shown in FIG. 44A by a dotted line in an enlarged scale. The smaller the better for the contact resistance between the electrode of contactor terminal 3*a* and electronic component 5. For example, the contact resistance is reduced by forming a plating layer 71 of gold (Au), palladium (Pd), rhodium (Rd), platinum (Pt), and the like, on the contact terminals 3*a*, which are formed of copper.

Also, in view of the fact that the tip end of the contact terminal 3*a* makes a contact with the contact electrode 5*a* of the electronic component 5 to be tested, it is preferable that the contact terminals 3*a* has a low affinity to the material of the electrode 5*a*. In the case that the electronic component 5 is a semiconductor device, the electrodes 5*a* are generally formed of a solder. In such a case, it is preferable to apply nickel (Ni) plating at the tip end part of the contact terminals 3a. Here, it should be noted that the plating process is not limited to form a single plating layer but may include the process of forming plural plating layers.

FIGS. 45A and 445B are diagrams explaining the example for the case a rough surface is made at the tip end part of the contact terminals. FIG. 45A shows the entire contact, while FIG. 45B shows the contactor terminal inside the circle that shows in FIG. 45A by a dotted line in an enlarged scale.

As shown in FIG. 45B, deposits or oxidation film formed on the electrode 5*a* of the electronic component 5 is removed effectively by providing such a rough surface of the tip end of the contact terminals 3*a*. Such a rough surface can be formed by controlling the plating process or by dipping the plated tip end of the contact terminals 3*a* into a chemical agent.

FIG. 46 is a diagram showing various examples of the tip end part of the contact terminal 3*a* and the electrode 5*a* of the electronic component 5. Any of these shapes may be used for the tip end of the contact terminals 3*a* in conformity with the shape of the electrode 5*a* of the electronic component 5. In the case the wires 3 carrying the contact terminals 3a thereon are formed by a patterning process, it should be noted that the contact terminals 3*a* can be patterned into an arbitrary shape.

What is claimed is:

1. A test assembly, comprising:
   a test apparatus;
   a contactor for electrically connecting the testing apparatus with a tested object, comprising:
      a film substrate of an insulating material;
      a plurality of wiring patterns provided on a surface of said substrate;
      a first end of each wiring pattern extending out from a first edge of said substrate as a first contact terminal; and
      a second end of each wiring pattern extending out from a second edge of said substrate as a second contact terminal,
   wherein when the contactor is positioned between the testing apparatus and the tested object, a part of said wiring patterns located between said first edge and second edge is deformed resiliently, so as to generate a contact force between the tested object and one of the first and second ends.

2. A test assembly as claimed in claim 1, wherein said substrate is formed of a resilient flexible substrate.

3. A test assembly as claimed in claim 1, wherein said film substrate includes a first substrate part, a second substrate part, and an interval between the first substrate part and the second substrate part, wherein said first contact terminal extends out from said first substrate part, wherein said second contact terminal extends out from said second substrate part, and wherein said wiring patterns between said first substrate part and said second substrate part are resiliently deformed.

4. A test assembly as claimed in claim 3, wherein a part of said wiring patterns between said first substrate part and said second substrate part is formed to be extended and shrunk in a longitudinal direction of said wiring pattern.

5. A test assembly as claimed in claim 4, wherein said deformable part has a zigzag shape.

6. A test assembly as claimed in claim 4, wherein the wiring patterns between said first substrate part and said second substrate part is formed by subjecting to at least one selected from the group consisting of a thermal annealing process, a plating process and an insulating coating process.

7. A test assembly as claimed in claim 4, wherein the wire between said first substrate part and said second substrate part is formed by subjecting to at least two selected from the group consisting of a thermal annealing process, a plating process and an insulating coating process.

8. A test assembly as claimed in claim 4, wherein the wire between said first substrate part and said second substrate part is formed by subjecting to a thermal annealing process, a plating process and an insulating coating process.

9. A test assembly as claimed in claim 3, wherein said second substrate is divided into a plurality of substrate pieces in correspondence to said plurality of wiring patterns, such that each substrate pieces extends in an elongating direction of said wiring pattern.

10. A test assembly as claimed in claim 3, wherein an elastic body is filled between said first substrate and said second substrate.

11. A test assembly as claimed in claim 1, wherein said substrate is provided with one or more of creasing lines perpendicular to an elongating direction of said wiring patterns, and wherein said substrate is deflectable along said creasing line.

12. A test assembly as claimed in claim 11, wherein said substrate is provided with an opening along one of said creasing lines.

13. A test assembly as claimed in claim 1, wherein said substrate includes at least one opening facilitating deformation of said substrate.

14. A test assembly as claimed in claim 13, wherein said opening is provided between adjacent wiring patterns.

15. A test assembly as claimed in claim 13, wherein said opening is provided in a part of said substrate on which said wiring pattern is provided.

16. A test assembly as claimed in claim 1, wherein said substrate includes a plurality of first substrates and a flexible second substrate interposed between said first substrates.

17. A test assembly as claimed in claim 1, wherein said first contact terminal makes a contact with a substrate of a testing apparatus and said second contact terminal makes a contact with an object to be tested,
   said contactor further comprising a contact terminal guide having guide openings inserted with said second contact terminals.

18. A test assembly as claimed in claim 17, wherein said guide opening has an oblique surface.

19. A test assembly as claimed in claim 17, wherein said contactor terminal guide is formed of a material having a thermal expansion coefficient substantially identical with a thermal expansion coefficient of said object.

20. A test assembly as claimed in claim 1, wherein said wiring patterns on said substrate are provided with a pitch corresponding to a pitch of electrodes of an object to be tested.

21. A test assembly as claimed in claim 1, wherein said wiring patterns are provided on one side of said substrate, said substrate further carrying a ground conductor layer on an opposite side thereof.

22. A test assembly as claimed in claim 1, wherein said substrate carries thereon a testing electronic component.

23. A test assembly as claimed in claim 22, wherein said testing electronic component is an A/D converter convening an analog signal from an object to be tested into a digital signal.

24. A test assembly as claimed in claim 1, wherein said wirings are provided on said substrate such that a pitch of said first contact terminals is larger than a pitch of said second contact terminals.

25. A test assembly as claimed in claim 1, wherein said second contact terminals are provided with a plating process.

26. A test assembly as claimed in claim 1, wherein said second contact terminals have a rough surface as compared with other part of said wiring patterns.

27. A test assembly as claimed in claim 1, wherein said second contact terminals have a tip end shaped in correspondence to a shape of electrodes of an object to be tested.

28. A contactor, comprising:

a plurality of stacking units stacked with each other, each of said stacking units comprising a film substrate of an insulating material and a plurality of wiring patterns provided on a surface of said substrate, in each of said plurality of stacking units, a first end of each wiring pattern extending out from a first edge of said substrate as a first contact terminal, a second end of each wiring pattern extending out from a second edge of said substrate as a second contact terminal, wherein a part of said contactor located between said first edge and second edge can be deformed resiliently.

29. A contactor, comprising:

a plurality of stacking units stacked with each other with a plurality of intervening spacers interposed between a stacking unit and an adjacent stacking unit, said intervening spaces separating said stacking unit and said adjacent stacking unit with a distance corresponding to a width of said intervening spacers, each of said stacking units comprising a film substrate of an insulating material and a plurality of wiring patterns provided on a surface of said substrate, in each of said plurality of stacking units, a first end of each wiring pattern extending out from a first edge of said substrate as a first contact terminal, a second end of each wiring pattern extending out from a second edge of said substrate as a second contact terminal, wherein a part of said contactor located between said first edge and second edge can be deformed resiliently.

30. A contactor as claimed in claim 29, wherein said spacers have different widths.

31. A contactor as claimed in claim 30, wherein said spacers have respective widths such that said substrate of said stacking unit and said substrate of said adjacent stacking unit form an angle therebetween.

32. A contactor as claimed in claim 29, wherein each substrate of said plurality of stacking units is divided into a plurality of substrate pieces in correspondence to a wiring pattern such that each of said substrate pieces extends in an elongating direction of said wiring pattern.

\* \* \* \* \*